United States Patent

Tanigawa et al.

(10) Patent No.: US 10,519,279 B2
(45) Date of Patent: Dec. 31, 2019

(54) THERMOSETTING RESIN COMPOSITION, PREPREG, LAMINATE AND MULTILAYER PRINTED WIRING BOARD

(71) Applicant: HITACHI CHEMICAL COMPANY, LTD., Tokyo (JP)

(72) Inventors: Takao Tanigawa, Tokyo (JP); Yasuyuki Mizuno, Tokyo (JP); Tomio Fukuda, Tokyo (JP); Yuki Nagai, Tokyo (JP); Hikari Murai, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 51 days.

(21) Appl. No.: 15/570,174

(22) PCT Filed: Apr. 28, 2016

(86) PCT No.: PCT/JP2016/063497
§ 371 (c)(1),
(2) Date: Oct. 27, 2017

(87) PCT Pub. No.: WO2016/175325
PCT Pub. Date: Nov. 3, 2016

(65) Prior Publication Data
US 2018/0127547 A1 May 10, 2018

(30) Foreign Application Priority Data

Apr. 30, 2015 (JP) .................................. 2015-093508

(51) Int. Cl.
| | |
|---|---|
| *C08G 73/10* | (2006.01) |
| *C08G 65/333* | (2006.01) |
| *C08J 5/24* | (2006.01) |
| *C08K 5/51* | (2006.01) |
| *C08L 63/00* | (2006.01) |
| *C08L 71/12* | (2006.01) |
| *C08L 79/04* | (2006.01) |
| *B32B 27/00* | (2006.01) |
| *H05K 1/03* | (2006.01) |

(52) U.S. Cl.
CPC .......... *C08G 73/1046* (2013.01); *B32B 27/00* (2013.01); *C08G 65/333* (2013.01); *C08J 5/24* (2013.01); *C08K 5/51* (2013.01); *C08L 63/00* (2013.01); *C08L 71/12* (2013.01); *C08L 79/04* (2013.01); *C08L 2203/20* (2013.01); *H05K 1/0313* (2013.01)

(58) Field of Classification Search
CPC .......... C08G 73/10; C08G 65/333; C08J 5/24; C08K 5/51; C08L 63/00; C08L 71/12; C08L 79/04

USPC ................................................. 524/115
See application file for complete search history.

(56) References Cited

U.S. PATENT DOCUMENTS

| | | | | |
|---|---|---|---|---|
| 5,596,040 | A | * | 1/1997 | Miya ..................... C08L 71/123 525/133 |
| 9,828,466 | B2 | * | 11/2017 | Mizuno ................ H05K 1/0373 |
| 2009/0312519 | A1 | | 12/2009 | Uera et al. |
| 2013/0075138 | A1 | | 3/2013 | Yu |
| 2017/0051109 | A1 | * | 2/2017 | Mizuno ................ H05K 1/0373 |

FOREIGN PATENT DOCUMENTS

| | | |
|---|---|---|
| JP | 58-069046 A | 4/1983 |
| JP | 61-018937 A | 1/1986 |
| JP | 2001-302900 A | 10/2001 |
| JP | 2003-292767 A | 10/2003 |
| JP | 2005-225913 A | 8/2005 |
| JP | 2008-095061 A | 4/2008 |
| JP | 2010-018791 A | 1/2010 |
| JP | 2010-138364 A | 6/2010 |
| JP | 2011-225639 A | 11/2011 |
| WO | 2015/152427 A1 | 10/2015 |
| WO | WO2015/152427 | * 10/2015 |

* cited by examiner

*Primary Examiner* — Deve V Hall
(74) *Attorney, Agent, or Firm* — Fitch, Even, Tabin & Flannery, LLP

(57) ABSTRACT

Provided are a thermosetting resin composition having especially good compatibility and having dielectric properties (low dielectric constant and low dielectric dissipation factor) in a high frequency range, high adhesion to conductor, excellent heat resistance, high glass transition temperature, low thermal expansion coefficient and high flame retardancy, and a prepreg, a laminate and a multilayer printed wiring board using the resin composition. Specifically, the thermosetting resin composition contains (A) a polyphenylene ether derivative having an N-substituted maleimide structure-containing group and a structural unit represented by the following general formula (I) in one molecule, (B) at least one thermosetting resin selected from the group consisting of epoxy resins, cyanate resins and maleimide compounds, and (C) a phosphorus flame retardant:

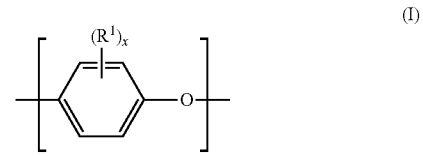

(I)

wherein $R^1$ each independently represents an aliphatic hydrocarbon group having 1 to 5 carbon atoms, or a halogen atom, and x represents an integer of 0 to 4.

15 Claims, No Drawings

THERMOSETTING RESIN COMPOSITION, PREPREG, LAMINATE AND MULTILAYER PRINTED WIRING BOARD

CROSS-REFERENCE TO RELATED APPLICATIONS

This application is a U.S. national phase application filed under 35 U.S.C. § 371 of International Application No. PCT/JP2016/063497, filed Apr. 28, 2016, designating the United States, which claims benefit of the filing date of JP 2015-093508, filed Apr. 30, 2015, which is hereby incorporated herein by reference in its entirety.

TECHNICAL FIELD

The present invention relates to a thermosetting resin composition containing a polyphenylene ether derivative, and to a prepreg, a laminate and a multilayer printed wiring board.

BACKGROUND ART

Signals used in mobile communication devices, such as a cell phone, base station apparatuses for them, network infrastructure devices, such as a server and a router, large-sized computers, and the like are being increased in the speed and capacity. In accordance with this, printed wiring boards mounted on these electronic devices are required to adapt to high-frequency signals, and a substrate material having excellent dielectric characteristics (low dielectric constant and low dielectric dissipation factor; hereinafter these may be referred to as high frequency properties) in a high frequency range that enable reduction of a transmission loss is demanded. Recently, as such applications that handle high-frequency signals, practical realization and practical use planning of novel systems that handle high-frequency wireless signals in an ITS field (in connection with automobiles and traffic systems) as well as in a field of indoor short-distance communications systems, in addition to the above-mentioned electronic devices, is being promoted, and in future, low transmission-loss substrate materials are expected to be required for the printed wiring boards to be mounted on these devices.

Further, in view of the environmental problems encountered in recent years, mounting of electronic parts using a lead-free solder and achieving flame retardancy free of a halogen are demanded, and therefore the material for a printed wiring board is needed to have higher heat resistance and more excellent flame retardancy than conventional.

Conventionally, for a printed wiring board required to have a low transmission loss, a polyphenylene ether (PPE) resin has been used as a heat-resistant thermoplastic polymer excellent in high frequency properties. For example, a method of using a polyphenylene ether and a thermosetting resin as combined has been proposed. Specifically, a resin composition containing a polyphenylene ether and an epoxy resin (see, for example, PTL 1), a resin composition using a polyphenylene ether in connection with a cyanate ester resin having a low dielectric constant among thermosetting resins (see, for example, PTL 2) and the like have been disclosed.

However, the resin compositions described in the above-mentioned PTL's 1 and 2 are unsatisfactory collectively in the high frequency properties in a GHz region, the adhesion to conductor, the low thermal expansion coefficient, and the flame retardancy. In addition, the compatibility of polyphenylene ether with a thermosetting resin is low, and therefore the heat resistance of the resultant resin composition may often lower.

Meanwhile, the present inventors have proposed a resin composition having a polyphenylene ether resin and a polybutadiene resin as a base, wherein the resin composition can be improved in the compatibility, heat resistance, low thermal expansion coefficient, adhesion to conductor, and the like by performing semi-IPN (semi-interpenetrating network) formation in the production stage (A-stage) of producing a resin composition containing an organic solvent (for example, PTL 3). However, the substrate material recently used for a printed wiring board is not only required to adapt to high-frequency signals, but also required to have high adhesion to conductor, low thermal expansion coefficient, high glass transition temperature, high flame retardancy, and the like due to the demands for an increase in the density, high reliability, and adaptability to consideration of the environment.

For example, the adhesion to conductor is desired to be 0.58 kN/m or more, and further 0.6 kN/m or more, in terms of a copper foil peel strength as measured using a low profile copper foil (Rz: 1 to 2 μm) having a very small surface roughness on the side to be bonded to resin.

Further, the substrate material for printed wiring board used in the application of network related devices, such as a server and a router, is needed to be stacked into the increased number of layers as the density of the wiring board is increased, and therefore the substrate material is required to have high reflow heat resistance and through-hole reliability. The glass transition temperature of the material as a yardstick for the above properties is desirably 200° C. or higher, and the thermal expansion coefficient (in the Z-direction at the Tg or lower) is desirably 45 ppm/° C. or less, further desirably 43 ppm/° C. or less. For achieving low thermal expansion property, the incorporation of an inorganic filler into the resin composition is effective; however, in a multilayer printed wiring board with the increased number of layers, for surely obtaining the flow properties of the resin for circuit packing, the amount of the inorganic filler to be incorporated is restricted. Therefore, it is desired that even when the amount of the inorganic filler incorporated is relatively small, the resultant resin composition is desired to secure the above-mentioned required values.

With respect to high frequency properties, excellent dielectric properties in a higher frequency range are desired, and a substrate material using an ordinary E glass substrate is desired to have a dielectric constant of 3.8 or less, more desirably 3.7 or less, and even more desirably 3.6 or less, and to have an dielectric dissipation factor of 0.007 or less, more desirably 0.006 or less. Furthermore, a substrate material generally tends to have an increased dielectric dissipation factor at a higher frequency, but is increasingly strongly needed to satisfy the above-mentioned required values in a 10 GHz or more band which is a frequency band higher than the conventional 1 to 5 GHz band for the dielectric properties values.

For securing flame retardancy, in general, a halogen element-containing flame retardant, especially a bromine-based flame retardant has been used. However, from the viewpoint of recent global environment conservation and aggravation prevention, a technique for flame retardation not using a halogen element (especially chlorine atom, bromine atom) that has a risk of generation of dioxins, benzofuran or the like has become desired.

CITATION LIST

Patent Literature

PTL 1: JP 58-069046 A
PTL 2: JP 61-018937 B
PTL 3: JP 2008-95061 A

SUMMARY OF INVENTION

Technical Problem

In consideration of the current situation as above, an object of the present invention is to provide a thermosetting resin composition having especially excellent compatibility and having good dielectric properties in a high frequency range (low dielectric constant and low dielectric dissipation factor), high adhesion to conductor, excellent heat resistance, high glass transition temperature, low thermal expansion coefficient, and high flame retardancy, and to provide a prepreg, a laminate, and a multilayer printed wiring board using the resin composition.

Solution to Problem

The present inventors have conducted extensive and intensive studies with a view toward solving the above-mentioned problems. As a result, the inventors have found that a prepreg and a laminate using a thermosetting resin composition that contains a polyphenylene ether derivative having a specific molecular structure, a specific thermosetting resin and a phosphorus flame retardant can express excellent high frequency properties, high heat resistance, high adhesion to conductors, high glass transition temperature, low thermal expansion coefficient and high flame retardancy, and have completed the present invention.

That is, the present invention relates to the following [1] to [14].

[1] A thermosetting resin composition containing:

(A) a polyphenylene ether derivative having an N-substituted maleimide structure-containing group and a structural unit represented by the following general formula (I) in one molecule, (B) at least one thermosetting resin selected from the group consisting of an epoxy resin, a cyanate resin and a maleimide compound, and (C) a phosphorus flame retardant:

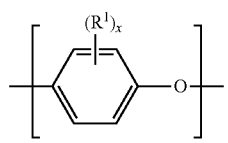

(I)

wherein $R^1$ each independently represents an aliphatic hydrocarbon group having 1 to 5 carbon atoms, or a halogen atom, and x represents an integer of 0 to 4.

[2] The thermosetting resin composition according to the above [1], wherein the N-substituted maleimide structure-containing group is a group represented by the following general formula (Z):

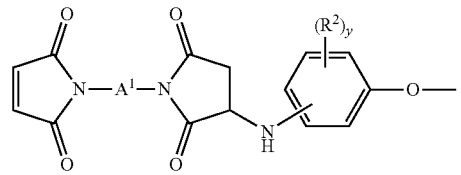

(Z)

wherein $R^2$ each independently represents an aliphatic hydrocarbon group having 1 to 5 carbon atoms, or a halogen atom, y represents an integer of 0 to 4, and $A^1$ represents a group represented by the following general formula (II), (III), (IV) or (V):

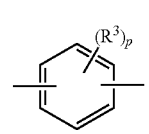

(II)

wherein $R^3$ each independently represents an aliphatic hydrocarbon group having 1 to 5 carbon atoms, or a halogen atom, and p represents an integer of 0 to 4:

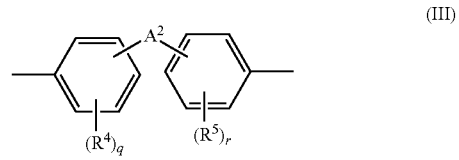

(III)

wherein $R^4$ and $R^5$ each independently represent an aliphatic hydrocarbon group having 1 to 5 carbon atoms, or a halogen atom, $A^2$ represents an alkylene group having 1 to 5 carbon atoms, an alkylidene group having 2 to 5 carbon atoms, an ether group, a sulfide group, a sulfonyl group, a carbonyloxy group, a keto group, a single bond, or a group represented by the following general formula (III-1), and q and r each independently represent an integer of 0 to 4:

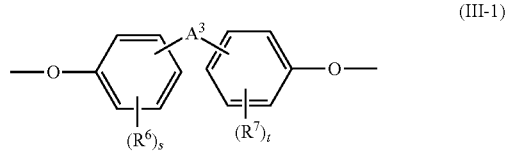

(III-1)

wherein $R^6$ and $R^7$ each independently represent an aliphatic hydrocarbon group having 1 to 5 carbon atoms, or a halogen atom, $A^3$ represents an alkylene group having 1 to 5 carbon atoms, an isopropylidene group, an ether group, a sulfide group, a sulfonyl group, a carbonyloxy group, a keto group or a single bond, and s and t each independently represent an integer of 0 to 4:

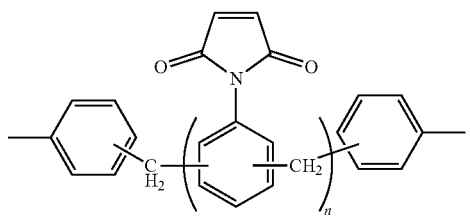

wherein n represents an integer of 0 to 10:

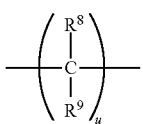

wherein $R^8$ and $R^9$ each independently represent a hydrogen atom, or an aliphatic hydrocarbon group having 1 to 5 carbon atoms, and u represents an integer of 1 to 8.

[3] The thermosetting resin composition according to the above [1] or [2], wherein the structural unit represented by the general formula (I) is a structural unit represented by the following formula (I'):

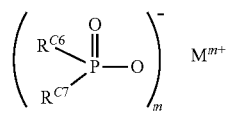

[4] The thermosetting resin composition according to the above [2] or [3], wherein $A^1$ in the general formula (Z) is a group represented by any of the following formulae:

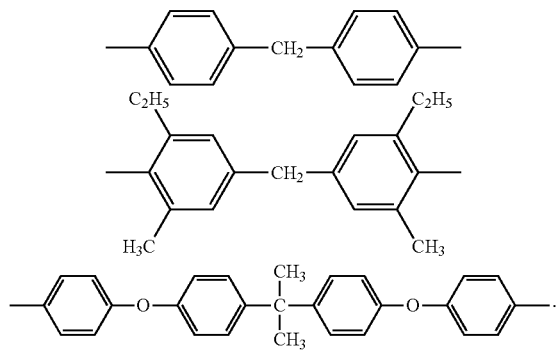

[5] The thermosetting resin composition according to any one of the above [1] to [4], wherein the phosphorus flame retardant (C) is at least one selected from an aromatic phosphate, and a metal salt of a disubstituted phosphinic acid.

[6] The thermosetting resin composition according to the above [5], wherein the aromatic phosphate is represented by the following general formula (C-1) or (C-2), and the metal salt of a disubstituted phosphinic acid is represented by the following general formula (C-3):

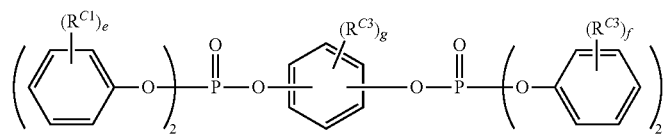

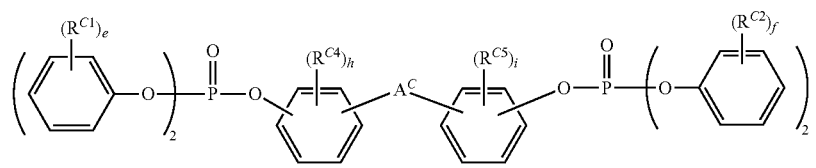

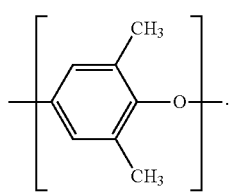

wherein $R^{C1}$ to $R^{C5}$ each independently represent an aliphatic hydrocarbon group having 1 to 5 carbon atoms, or a halogen atom, $A^c$ represents an alkylene group having 1 to 5 carbon atoms, an alkylidene group having 2 to 5 carbon atoms, an ether group, a sulfide group, a sulfonyl group, a carbonyloxy group, a keto group, or a single bond, e and f each independently represent an integer of 0 to 5, g, h and i each independently represent an integer of 0 to 4, $R^{C6}$ and $R^{C7}$ each independently represent an aliphatic hydrocarbon group having 1 to 5 carbon atoms, or an aromatic hydrocarbon group having 6 to 14 carbon atoms, M represents a lithium atom, a sodium atom, a potassium atom, a calcium atom, a magnesium atom, an aluminum atom, a titanium atom or a zinc atom, and m1 represents an integer of 1 to 4.

[7] The thermosetting resin composition according to any one of the above [1] to [6], wherein the maleimide compound as the component (B) is a polymaleimide compound (a) having at least two N-substituted maleimide groups in one molecule, or a polyaminobismaleimide compound (c) represented by the following general formula (VI):

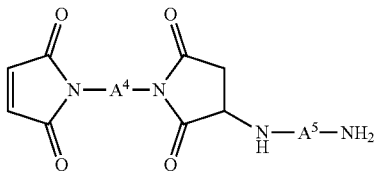

(VI)

wherein $A^4$ has the same definition as that of $A^1$ in the general formula (Z), and $A^5$ represents a group represented by the following general formula (VII):

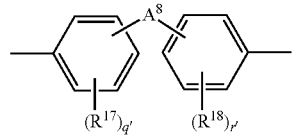

(VII)

wherein $R^{17}$ and $R^{18}$ each independently represent an aliphatic hydrocarbon group having 1 to 5 carbon atoms, an alkoxy group having 1 to 5 carbon atoms, a hydroxyl group or a halogen atom, $A^8$ represents an alkylene group having 1 to 5 carbon atoms, an alkylidene group having 2 to 5 carbon atoms, an ether group, a sulfide group, a sulfonyl group, a carbonyloxy group, a keto group, a fluorenylene group, a single bond, or a group represented by the following general formula (VII-1) or (VII-2), and q' and r' each independently represent an integer of 0 to 4:

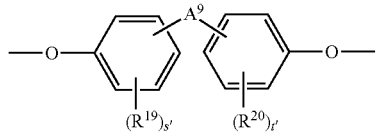

(VII-1)

wherein $R^{19}$ and $R^{20}$ each independently represent an aliphatic hydrocarbon group having 1 to 5 carbon atoms, or a halogen atom, $A^9$ represents an alkylene group having 1 to 5 carbon atoms, an isopropylidene group, an m-phenylenediisopropylidene group, a p-phenylenediisopropylidene group, an ether group, a sulfide group, a sulfonyl group, a carbonyloxy group, a keto group or a single bond, and s' and t' each independently represent an integer of 0 to 4:

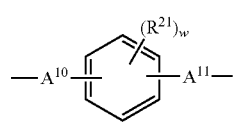

(VII-2)

wherein $R^{21}$ represents an aliphatic hydrocarbon group having 1 to 5 carbon atoms, or a halogen atom, $A^{10}$ and $A^{11}$ each independently represent an alkylene group having 1 to 5 carbon atoms, an isopropylidene group, an ether group, a sulfide group, a sulfonyl group, a carbonyloxy group, a keto group, or a single bond, and w represents an integer of 0 to 4.

[8] The thermosetting resin composition according to any one of the above [1] to [7], wherein the content ratio of the component (A) to the component (B) [(A)/(B)] is from 5/95 to 80/20 by mass.

[9] The thermosetting resin composition according to any one of the above [1] to [8], further containing an inorganic filler (D).

[10] The thermosetting resin composition according to any one of the above [1] to [9], further containing a curing accelerator (E).

[11] The thermosetting resin composition according to any one of the above [1] to [10], further containing an organic solvent.

[12] A prepreg including the thermosetting resin composition of any one of the above [1] to [11] and a sheet-form fiber reinforced substrate.

[13] A laminate including the prepreg of the above [12] and a metal foil.

[14] A multilayer printed wiring board including the prepreg of the above [12] or the laminate of the above [13].

Advantageous Effects of Invention

The thermosetting resin composition of the present invention has particularly good compatibility, excellent high frequency properties (low dielectric constant, low dielectric dissipation factor), high adhesion to conductor, excellent heat resistance, high glass transition temperature, low thermal expansion coefficient and high flame retardancy. Accordingly, the prepreg and the laminate to be obtained using the thermosetting resin composition can be favorably used for electronic parts such as multilayer printed wiring boards, etc.

DESCRIPTION OF EMBODIMENTS

Embodiments of the present invention are described in detail hereinunder.
[Thermosetting Resin Composition]

One aspect of the present invention is a thermosetting resin composition containing:

(A) a polyphenylene ether derivative having an N-substituted maleimide structure-containing group and a structural unit represented by the following general formula (I) in one molecule [hereinafter this may be simply abbreviated as polyphenylene ether derivative (A) or component (A)], (B) at least one thermosetting resin selected from the group consisting of an epoxy resin, a cyanate resin and a maleimide compound [hereinafter this may be simply abbreviated as thermosetting resin (B) or component (B)], and (C) a phosphorus flame retardant [hereinafter this may be abbreviated as component (C)]:

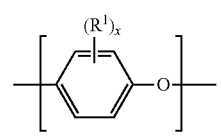

(I)

wherein $R^1$ each independently represents an aliphatic hydrocarbon group having 1 to 5 carbon atoms, or a halogen atom, and x represents an integer of 0 to 4.

The components are described in order.

(Polyphenylene Ether Derivative (A))

The polyphenylene ether derivative (A) has an N-substituted maleimide structure-containing group and a structural unit represented by the above-mentioned general formula (I) in one molecule. In particular, since the polyphenylene ether derivative (A) has at least one N-substituted maleimide structure-containing group in one molecule, the thermosetting resin composition can have excellent high frequency properties (low dielectric constant, low dielectric dissipation factor), high adhesion to conductor, excellent heat resistance, high glass transition temperature, low thermal expansion coefficient and high flame retardancy. Here, the thermal expansion coefficient as referred to in the present invention means a value also called a linear expansion coefficient.

$R^1$ in the general formula (I) each independently represents an aliphatic hydrocarbon group having 1 to 5 carbon atoms, or a halogen atom. Examples of the aliphatic hydrocarbon group include a methyl group, an ethyl group, an n-propyl group, an isopropyl group, an n-butyl group, an isobutyl group, a t-butyl group, an n-pentyl group, etc. The aliphatic hydrocarbon group may be an aliphatic hydrocarbon group having 1 to 3 carbon atoms, and may be a methyl group. Examples of the halogen atom include a fluorine atom, a chlorine atom, a bromine atom, an iodine atom, etc. From the viewpoint of halogen-freeness, the halogen atom may be a fluorine atom.

Among the above, $R^1$ may be an aliphatic hydrocarbon group having 1 to 5 carbon atoms.

x is an integer of 0 to 4, and may be an integer of 0 to 2, and may be 2. When x is 1 or 2, $R^1$ may be substituted at the ortho-position on the benzene ring (based on the substitution position of the oxygen atom). When x is 2 or more, plural $R^1$'s may be the same or different.

Specifically, the structural unit represented by the general formula (I) may be a structural formula represented by the following general formula (I').

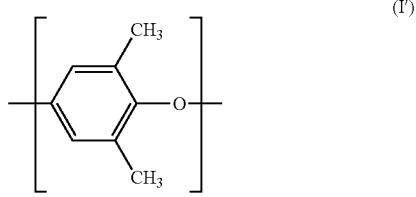

(I')

The N-substituted maleimide structure-containing group that the polyphenylene ether derivative (A) has may be, from the viewpoint of high frequency properties (low dielectric constant, low dielectric dissipation factor), adhesion to conductor, heat resistance, glass transition temperature, thermal expansion coefficient and flame retardancy, a group containing a bismaleimide structure in which the nitrogen atoms of the two maleimide groups bond to each other via an organic group, and may be a group represented by the following general formula (Z):

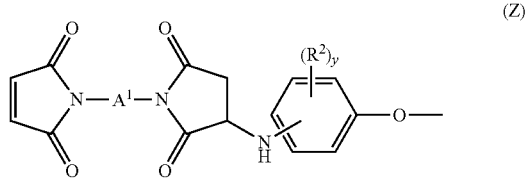

(Z)

wherein $R^2$ each independently represents an aliphatic hydrocarbon group having 1 to 5 carbon atoms, or a halogen atom, y represents an integer of 0 to 4, and $A^1$ represents a group represented by the following general formula (II), (III), (IV) or (V).

The aliphatic hydrocarbon group having 1 to 5 carbon atoms and the halogen atom that $R^2$ represents may be described in the same manner as that for the case of $R^1$.

y is an integer of 0 to 4, and may be an integer of 0 to 2, and may be 0. When y is an integer of 2 or more, plural $R^2$'s may be the same or different.

The group represented by the general formula (II), (III), (IV) or (V) that $A^1$ represents is as follows:

(II)

wherein $R^3$ each independently represents an aliphatic hydrocarbon group having 1 to 5 carbon atoms, or a halogen atom, and p represents an integer of 0 to 4.

The aliphatic hydrocarbon group having 1 to 5 carbon atoms and the halogen atom that $R^3$ represents may be described in the same manner as that for the case of $R^1$.

p is an integer of 0 to 4, and, from the viewpoint of easy availability, may be an integer of 0 to 2, or 0 or 1, or 0. When p is an integer of 2 or more, plural $R^3$'s may be the same or different:

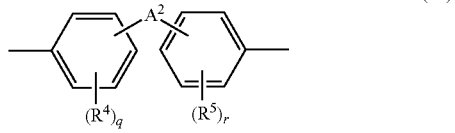

(III)

wherein $R^4$ and $R^5$ each independently represent an aliphatic hydrocarbon group having 1 to 5 carbon atoms, or a halogen atom, $A^2$ represents an alkylene group having 1 to 5 carbon atoms, an alkylidene group having 2 to 5 carbon atoms, an ether group, a sulfide group, a sulfonyl group, a carbonyloxy group, a keto group, a single bond, or a group represented by the following general formula (III-1), and q and r each independently represent an integer of 0 to 4.

The aliphatic hydrocarbon group having 1 to 5 carbon atoms and the halogen atom that $R^4$ and $R^5$ represent include the same ones as those for $R^1$. The aliphatic hydrocarbon group may be an aliphatic hydrocarbon group having 1 to 3 carbon atoms, and may be a methyl group or an ethyl group, and may be an ethyl group.

Examples of the alkylene group having 1 to 5 carbon atoms that $A^2$ represents include a methylene group, a 1,2-dimethylene group, a 1,3-trimethylene group, a 1,4-tetramethylene group, a 1,5-pentamethylene group, etc. The alkylene group may be, from the viewpoint of high frequency properties (low dielectric constant, low dielectric dissipation factor), adhesion to conductor, heat resistance, glass transition temperature, thermal expansion coefficient and flame retardancy, an alkylene group having 1 to 3 carbon atoms, or may be a methylene group.

Examples of the alkylidene group having 2 to 5 carbon atoms that $A^2$ represents include an ethylidene group, a propylidene group, an isopropylidene group, a butylidene group, an isobutylidene group, a pentylidene group, an isopentylidene group, etc. Among these, from the viewpoint of high frequency properties (low dielectric constant, low dielectric dissipation factor), adhesion to conductor, heat resistance, glass transition temperature, thermal expansion coefficient and flame retardancy, it may be an isopropylidene group.

Among the above-mentioned choices, $A^2$ may be an alkylene group having 1 to 5 carbon atoms or an alkylidene group having 2 to 5 carbon atoms.

q and r each are independently an integer of 0 to 4, and, from the viewpoint of easy availability, may be an integer of 0 to 2, or 0 or 2. When q or r is an integer of 2 or more, plural $R^4$'s or plural $R^5$'s each may be the same or different.

The group represented by the general formula (III-1) that $A^2$ represents is as follows:

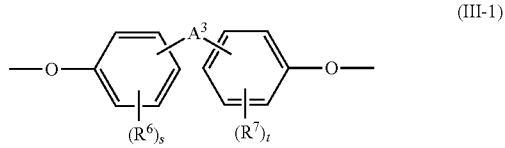

(III-1)

wherein $R^6$ and $R^7$ each independently represent an aliphatic hydrocarbon group having 1 to 5 carbon atoms, or a halogen atom, $A^3$ represents an alkylene group having 1 to 5 carbon atoms, an isopropylidene group, an ether group, a sulfide group, a sulfonyl group, a carbonyloxy group, a keto group or a single bond, and s and t each independently represent an integer of 0 to 4.

The aliphatic hydrocarbon group having 1 to 5 carbon atoms and the halogen atom that $R^6$ and $R^7$ represent may be described in the same manner as that for the case of $R^4$ and $R^5$.

The alkylene group having 1 to 5 carbon atoms that $A^3$ represents include the same ones as the alkylene group having 1 to 5 carbon atoms that $A^2$ represents.

From among the above-mentioned choices, the alkylidene group having 2 to 5 carbon atoms may be selected for $A^3$.

s and t each are independently an integer of 0 to 4, and, from the viewpoint of easy availability, may be an integer of 0 to 2, or may be 0 or 1, or may be 0. When s or t is an integer of 2 or more, plural $R^6$'s or plural $R^7$'s each may be the same or different.

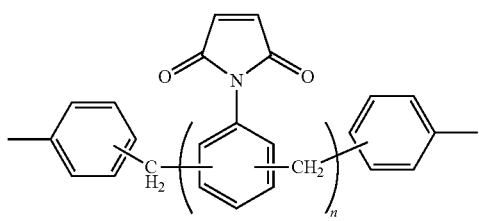

(IV)

In the formula, n represents an integer of 0 to 10.

From the viewpoint of easy availability, n may be an integer of 0 to 5, or may be an integer of 0 to 3.

(V)

In the formula, $R^8$ and $R^9$ each independently represent a hydrogen atom, or an aliphatic hydrocarbon group having 1 to 5 carbon atoms, and u represents an integer of 1 to 8.

The aliphatic hydrocarbon group having 1 to 5 carbon atoms and the halogen atom that $R^8$ and $R^9$ represent may be described in the same manner as that for the case of $R^1$.

u is an integer of 1 to 8, and may be an integer of 1 to 3, or may be 1.

$A^1$ in the group represented by the general formula (Z) may be, from the viewpoint of high frequency properties (low dielectric constant, low dielectric dissipation factor), adhesion to conductor, heat resistance, glass transition temperature, thermal expansion coefficient and flame retardancy, a group represented by any of the following formulae.

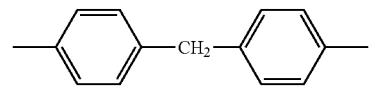

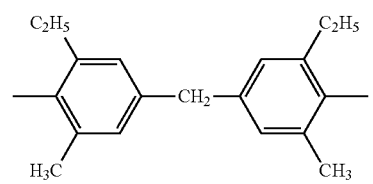

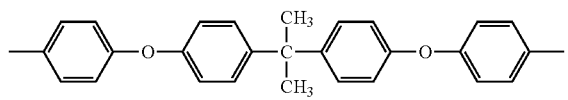

The polyphenylene ether derivative (A) may be a polyphenylene ether derivative represented by the following general formula (A').

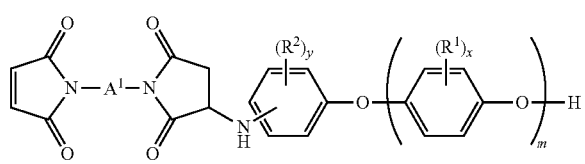

(A')

In the formula, $A^1$, $R^1$, $R^2$, x and y are as defined hereinabove, and m represents an integer of 1 or more.

m may be an integer of 1 to 300, or may be an integer of 10 to 300, or may be an integer of 30 to 200, or may be an integer of 50 to 150.

The polyphenylene ether derivative (A) may be a polyphenylene ether derivative represented by any of the following formulae.

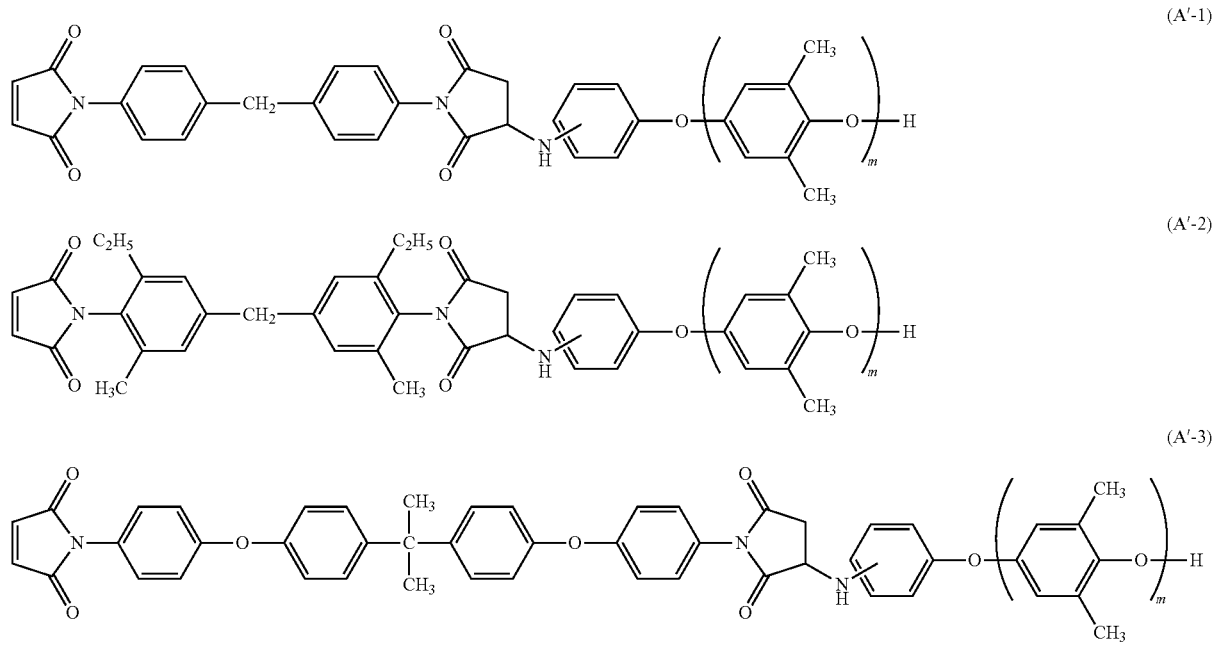

In the formulae, m is the same as m in the general formula (A').

From the viewpoint of inexpensive raw materials, the derivative may be a polyphenylene ether derivative of the above formula (A'-1), from the viewpoint of excellent dielectric properties and low water absorbability, it may be a polyphenylene ether derivative represented by the formula (A'-2), and from the viewpoint of excellent adhesion to conductor and mechanical properties (elongation, strength at break, etc.), it may be a polyphenylene ether derivative represented by the formula (A'-3). Accordingly, in conformity to the intended properties, one alone or two or more of the polyphenylene ether derivatives of the formulae (A'-1) to (A'-3) may be used either singly or as combined.

The number average molecular weight of the polyphenylene ether derivative (A) of the present invention may be 5,000 to 12,000, or may be 7,000 to 12,000, or may be 7,000 to 10,000. When the number average molecular weight is 5,000 or more, the thermosetting resin composition of the present invention and the prepreg and the laminate using the composition tend to have a more favorable glass transition temperature. When the number average molecular weight is 12,000 or less, the thermosetting resin composition of the present invention tends to be readily molded into a laminate with better formability.

In this description, the number average molecular weight is a value calculated based on the calibration curve drawn using a standard polystyrene, according to gel permeation chromatography (GPC), and more precisely, a value measured according to the number average molecular weight measurement method described in the section of Examples.

(Method for Producing Polyphenylene Ether Derivative (A))

The polyphenylene ether derivative (A) may be obtained, for example, according to the production method mentioned below.

First, an aminophenol compound represented by the following general formula (VIII) [hereinafter referred to as aminophenol compound (VIII)] is reacted with a polyphenylene ether having, for example, a number average molecular weight of 15,000 to 25,000 in an organic solvent in a mode of known redistribution reaction, as associated with reduction in the molecular weight of the polyphenylene ether, to thereby produce a polyphenylene ether compound having a primary amino group in one molecule (A") (hereinafter this may be simply referred to as polyphenylene ether compound (A")), and then the polyphenylene ether compound (A") is reacted with a bismaleimide compound represented by the general formula (IX) [hereinafter referred to as bismaleimide compound (IX)] in a mode of Michael addition reaction to produce the polyphenylene ether derivative (A).

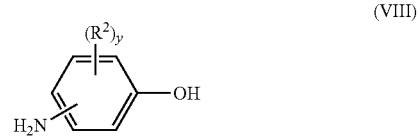

(VIII)

In the formula, $R^2$ and y are the same as those in the general formula (I).

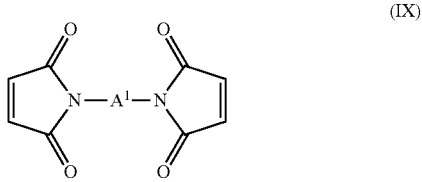

(IX)

In the formula, $A^1$ is the same as in the general formula (I).

Examples of the aminophenol compound (VIII) include o-aminophenol, m-aminophenol, p-aminophenol, etc. Among these, from the viewpoint of the reaction yield in producing the polyphenylene ether compound (A"), as well as the heat resistance in producing resin composition, prepreg and laminate, the compound may be m-aminophenol or p-aminophenol, or may be p-aminophenol.

The molecular weight of the polyphenylene ether compound (A") may be controlled by the amount to be used of the aminophenol compound (VIII), and when the amount of the aminophenol compound (VIII) used is larger, the molecular weight of the polyphenylene ether (A") is lower. Namely, the amount to be used of the aminophenol compound (VIII) may be adequately controlled so that the number average molecular weight of the polyphenylene ether derivative (A) to be produced finally could fall within a preferred range.

The amount to be incorporated of the aminophenol compound (VIII) is not specifically limited, but for example, when the number average molecular weight of the polyphenylene ether to be reacted with the aminophenol compound (VIII) is 15,000 to 25,000, the amount may fall within a range of 0.5 to 6 parts by mass relative to 100 parts by mass of the polyphenylene ether to give a polyphenylene ether derivative (A) having a number average molecular weight of 5,000 to 12,000.

Examples of the organic solvent for use in the production step for the polyphenylene ether compound (A") include, though not specifically limited thereto, alcohols such as methanol, ethanol, butanol, butyl cellosolve, ethylene glycol monomethyl ether, propylene glycol monomethyl ether, etc.; ketones such as acetone, methyl ethyl ketone, methyl isobutyl ketone, cyclohexanone, etc.; aromatic hydrocarbons such as toluene, xylene, mesitylene, etc.; esters such as methoxyethyl acetate, ethoxyethyl acetate, butoxyethyl acetate, ethyl acetate, etc.; nitrogen-containing compounds such as N,N-dimethylformamide, N,N-dimethylacetamide, N-methyl-2-pyrrolidone, etc. One alone or two or more kinds of these may be used either singly or as combined. Among these, from the viewpoint of solubility, toluene, xylene and mesitylene may be used.

In the production step for the polyphenylene ether compound (A"), a reaction catalyst may be used as needed. To the reaction catalyst, for example, the reaction catalyst in known redistribution reaction is applicable. For example, from the viewpoint of producing the polyphenylene ether compound (A") having a stable number average molecular weight with good reproducibility, an organic peroxide such as t-butylperoxyisopropyl monocarbonate or the like and a metal carboxylate such as manganese naphthenate or the like may be used as combined. The amount of the reaction catalyst to be used is not specifically limited. For example, from the viewpoint of the reaction speed and antigelation in producing the polyphenylene ether compound (A"), for example, the amount of the organic peroxide may be 0.5 to 5 parts by mass and that of the metal carboxylate may be 0.05 to 0.5 parts by mass relative to 100 parts by mass of the polyphenylene ether to be reacted with the aminophenol compound (VIII).

The aminophenol compound (VIII), the polyphenylene ether having a number average molecular weight of 15,000 to 25,000, an organic solvent and optionally a reaction catalyst are put in a reactor each in a predetermined amount, and reacted with heating, keeping the heat and stirring to give the polyphenylene ether compound (A"). For the reaction temperature and the reaction time in this step, the reaction conditions in known redistribution reaction are applicable.

From the viewpoint of operability and antigelation, and from the viewpoint of controlling the molecular weight of the polyphenylene ether compound (A") for obtaining the component (A) having a desired number average molecular weight, for example, the reaction may be carried out at a reaction temperature of 70 to 110° C. and for a reaction time of 1 to 8 hours.

A solution of the polyphenylene ether compound (A") thus produced in the manner as above may be continuously and directly fed to the next step of producing the polyphenylene ether derivative (A). In this stage, the solution of the polyphenylene ether compound (A") may be cooled, or may be controlled to be at the reaction temperature in the next step. As needed, the solution may be concentrated to remove a part of the organic solvent, or may be diluted by adding an organic solvent thereto, as described below.

Examples of the bismaleimide compound (IX) to be used in producing the polyphenylene ether derivative (A) include bis(4-maleimidophenyl)methane, polyphenylmethanemaleimide, bis(4-maleimidophenyl) ether, bis(4-maleimidophenyl) sulfone, 3,3'-dimethyl-5,5'-diethyl-4,4'-diphenylmethanebismaleimide, 4-methyl-1,3-phenylenebismaleimide, m-phenylenebismaleimide, 2,2-bis(4-(4-maleimidophenoxy)phenyl)propane, bis(4-maleimidophenyl) sulfone, bis(4-maleimidophenyl) sulfide, bis(4-maleimidophenyl) ketone, 2,2-bis(4-(4-maleimidophenoxy)phenyl)propane, bis(4-(4-maleimidophenoxy)phenyl) sulfone, 4,4'-bis(3-maleimidophenoxy)biphenyl, and 1,6-bismaleimido-(2,2,4-trimethyl)hexane. These may be used individually or in combination.

Of these, bis(4-maleimidophenyl)methane, 3,3'-dimethyl-5,5'-diethyl-4,4'-diphenylmethanebismaleimide, and 2,2-bis (4-(4-maleimidophenoxy)phenyl)propane may be selected.

Bis(4-maleimidophenyl)methane may be used because the polyphenylene ether derivative containing the formula (A'-1) above is obtained and it is inexpensive.

3,3'-Dimethyl-5,5'-diethyl-4,4'-diphenylmethanebismaleimide may be used because the polyphenylene ether derivative containing the formula (A'-2) above is obtained and exhibits excellent dielectric properties and low water absorption properties.

2,2-Bis(4-(4-maleimidophenoxy)phenyl)propane may be used because the polyphenylene ether derivative containing the formula (A'-3) above is obtained and exhibits high adhesion to conductor and excellent mechanical properties (elongation, strength at break).

The amount of the bismaleimide compound (IX) is determined according to the amount of the aminophenol compound (VIII) used. Specifically, the bismaleimide compound may be incorporated so that the equivalent ratio (Tb1/Ta1) of the maleimide group equivalent (Tb1) of the bismaleimide compound (IX) to the —$NH_2$ group equivalent (Ta1) of the aminophenol compound (VIII) could be in the range of 2 to 6, or in a rage of 2 to 4. When the bismaleimide compound is used in the equivalent ratio range as above, the thermosetting resin composition, the prepreg and the laminate of the present invention tend to have more excellent heat resistance, high glass transition temperature and high flame retardancy.

In the Michael addition reaction conducted when producing the polyphenylene ether derivative (A), a reaction catalyst may be used as needed. With respect to the reaction catalyst used, there is no particular limitation. However, examples of the reaction catalyst include acidic catalysts, such as p-toluenesulfonic acid; amines, such as triethylamine, pyridine, and tributylamine; imidazole compounds, such as methylimidazole and phenylimidazole; and phosphorus catalysts, such as triphenylphosphine. These may be used individually or in combination. With respect to the amount of the reaction catalyst incorporated, there is no particular limitation. However, for example, relative to 100 parts by mass of the polyphenylene ether compound (A"), the reaction catalyst can be used in an amount in the range of 0.01 to 5 parts by mass.

The bismaleimide compound (IX) and optionally a reaction catalyst and others are put into the solution of the polyphenylene ether compound (A") solution each in a predetermined amount, and reacted with heating, keeping the heat and stirring in a mode of Michael reaction to give the polyphenylene ether derivative (A). Regarding the reaction conditions in this step, for example, from the viewpoint of operability and antigelation, the reaction temperature may be 50 to 160° C., and the reaction time may be 1 to 10 hours. In addition, in this step, an organic solvent may be added, or the reaction system may be concentrated as mentioned above, to thereby control the reaction concentration (solid concentration), and the solution viscosity. For the additional organic solvent, the organic solvents exemplified in the section of the production step for the polyphenylene ether compound (A") are applicable, and one alone or two or more kinds of these may be used either singly or as combined. Among these, from the viewpoint of solubility, methyl ethyl ketone, cyclohexanone, propylene glycol monomethyl ether, N,N-dimethylformamide and N,N-dimethylacetamide may be selected.

The reaction concentration (solid concentration) in the production step for the polyphenylene ether derivative (A) and the polyphenylene ether compound (A") is not specifically limited, but, for example, in each production step, the concentration may be 10 to 60% by mass, and may be 20 to 50% by mass. When the reaction concentration is 10% by mass or more, the reaction speed is not too low, and tends to be favorable from the viewpoint of production cost. When the reaction concentration is 60% by mass or less, better solubility tends to be attained. If so, in addition, the solution viscosity may be low and the stirring efficiency tends to be good to suppress gelation.

After production of the polyphenylene ether derivative (A), a part or all of the organic solvent may be optionally removed from the solution for concentration, or an additional organic solvent may be added thereto for dilution, in accordance with the operability in taking out the derivative from the reactor or with the use condition (for example, solution viscosity or solution concentration suitable for production of prepreg) in preparing the thermosetting resin composition of the present invention by adding various thermosetting resins to the polyphenylene ether derivative (A). The additional organic solvent is not specifically limited, and one or more organic solvents mentioned above may be used.

The formation of the polyphenylene ether compound (A") and the polyphenylene ether derivative (A) in the above-mentioned production steps may be confirmed through GPC and IR analysis by sampling a small amount of the product after each step.

First, with respect to the polyphenylene ether compound (A"), the production of a desired polyphenylene ether compound (A") can be confirmed by GPC showing that the molecular weight is reduced to be lower than the polyphenylene ether having a number average molecular weight of 15,000 to 25,000 and that the peak of the aminophenol compound (VIII) as a raw material has disappeared, and by IR analysis showing that a peak of the primary amino group appears at 3,300 to 3,500 $cm^{-1}$. With respect to the polyphenylene ether derivative (A) which has been purified by reprecipitation, the production of a desired polyphenylene ether derivative (A) can be confirmed by IR analysis showing that the peak of the primary amino group at 3,300 to 3,500 $cm^{-1}$ has disappeared and that a peak of the carbonyl group of maleimide appears at 1,700 to 1,730 $cm^{-1}$.

The thermosetting resin composition of the present invention tends to be more excellent in adhesion to conductor, heat resistance, thermal expansion coefficient, flame retardancy and workability (in drilling, cutting) than the resin composition containing the polyphenylene ether compound (A") and the component (B) to be mentioned below.

(Thermosetting Resin (B))

The resin component (B) contained in the thermosetting resin composition of the present invention is at least one thermosetting resin selected from the group consisting of an epoxy resin, a cyanate resin and a maleimide compound. The maleimide compound does not include the above-mentioned polyphenylene ether derivative (A).

The epoxy resin may be an epoxy resin having two or more epoxy groups in one molecule. Here, the epoxy resin is grouped into a glycidyl ether-type epoxy resin, a glycidylamine-type epoxy resin, a glycidyl ester-type epoxy resin, etc. Among these, a glycidyl ether-type epoxy resin may be selected.

The epoxy resin is grouped into various types of epoxy resins depending on the difference in the main skeleton, and various types of the epoxy resins mentioned above may be further grouped into a bisphenol-type epoxy resin such as a bisphenol A-type epoxy resin, a bisphenol F-type epoxy resin, a bisphenol S-type epoxy resin, etc.; an alicyclic epoxy resin; an aliphatic linear epoxy resin; a novolak-type epoxy resin such as a phenol-novolak-type epoxy resin, a cresol-novolak-type epoxy resin, a bisphenol A-novolak-type epoxy resin, a bisphenol F-novolak-type epoxy resin, etc.; a phenol-aralkyl-type epoxy resin, a stilbene-type epoxy resin, a dicyclopentadiene-type epoxy resin, a naphthalene skeleton-containing epoxy resin such as a naphthol-novolak-type epoxy resin, a naphthol-aralkyl-type epoxy resin, etc.; a biphenyl-type epoxy resin, a biphenylaralkyl-type epoxy resin; a xylylene-type epoxy resin; a dihydroanthracene-type epoxy resin; a dicyclopentadiene-type epoxy resin, etc.

One alone or two or more kinds of epoxy resins may be used either singly or as combined. Among these, from the viewpoint of high frequency properties, heat resistance, glass transition temperature, thermal expansion coefficient and flame retardancy, a naphthalene skeleton-containing epoxy resin and a biphenylaralkyl-type epoxy resin may be used.

In the case where an epoxy resin is used as the component (B), if desired, a curing agent or a curing aid for epoxy resin may be used as combined. Examples of these include, though not specifically limited thereto, polyamine compounds such as diethylenetriamine, triethylenetetramine, diaminodiphenylmethane, m-phenylenediamine, dicyandiamide, etc.; polyphenol compounds such as bisphenol A, phenol-novolak resin, cresol-novolak resin, bisphenol A-novolak resin, phenolaralkyl resin, etc.; acid anhydrides such as phthalic anhydride, pyromellitic anhydride, etc.; carboxylic acid compounds; active ester compounds, etc. One alone or two or more of these may be used either singly or as combined. The amount thereof to be used is not specifically limited and may be adequately controlled depending on the object. Among these, from the viewpoint of heat resistance, glass transition temperature, thermal expansion coefficient, storage stability and insulation reliability, polyphenol compounds and active ester compounds may be used.

Examples of the cyanate resin include, though not specifically limited thereto, 2,2-bis(4-cyanatophenyl)propane, bis(4-cyanatophenyl)ethane, bis(3,5-dimethyl-4-cyanatophenyl)methane, 2,2-bis(4-cyanatophenyl)-1,1,1,3,3,3-hexafluoropropane, α,α'-bis(4-cyanatophenyl)-m-diisopropylbenzene, cyanate ester compound of phenol-added dicyclopentadiene polymer, phenol-novolak-type cyanate ester compound and cresol-novolak-type cyanate ester compound. One alone or two or more kinds of cyanate resins may be used either singly or as combined. Among these, from the viewpoint of production cost as well as from the viewpoint of total balance of high frequency properties and other properties, 2,2-bis(4-cyanatophenyl)propane may be used.

In the case where a cyanate resin is used as the component (B), if desired, a curing agent or a curing aid for cyanate resin may be used as combined. Examples of these include, though not specifically limited thereto, monophenol compounds, polyphenol compounds, amine compounds, alcohol compounds, acid anhydrides, carboxylic acid compounds, etc. One alone or two or more of these may be used either singly or as combined. The amount of the curing agent and the curing aid to be used is not specifically limited and may be adequately controlled depending on the object. Among these, from the viewpoint of high frequency properties, heat resistance, moisture absorption resistance and storage stability, monophenol compounds may be used.

In the case where a cyanate resin is used as combined with a monophenol compound, from the viewpoint of solubility in organic solvent, a method of pre-reacting them to give a phenol-modified cyanate prepolymer may be employed. Regarding the monophenol compound to be used in combination, all the prescribed amount thereof may be incorporated in prepolymerization, or the prescribed amount may be divided in portions and added portionwise before and after prepolymerization, but from the viewpoint of storage stability, the method of portionwise incorporating the compound may be employed.

The maleimide compound is not specifically limited, but, for example, at least one of (a) a polymaleimide compound having at least two N-substituted maleimide group in one molecule [hereinafter this may be referred to as component (a)] and (c) a polyaminobismaleimide compound represented by the following general formula (VI) (hereinafter this may be referred to as component (c)] may be contained. From the viewpoint of solubility in organic solvent, high frequency properties, adhesion to conductor and prepreg formability, the maleimide compound may be the polyaminobismaleimide compound (c).

The polyaminobismaleimide compound (c) may be obtained, for example, by reacting the component (a) and an aromatic diamine compound (b) having two primary amino groups in one molecule [hereinafter this may be referred to as component (b)] in a mode of Michael addition reaction in an organic solvent.

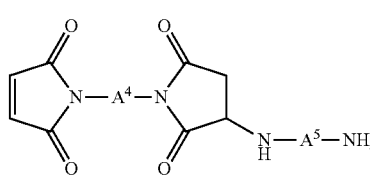

(VI)

In the formula, $A^4$ has the same definition as $A^1$ in the above general formula (Z), $A^5$ is a group represented by the following general formula (VII).

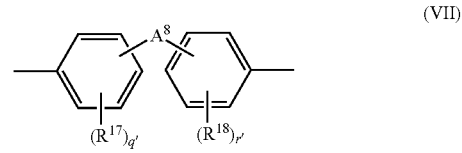

(VII)

In the formula, $R^{17}$ and $R^{18}$ each independently represent an aliphatic hydrocarbon group having 1 to 5 carbon atoms, an alkoxy group having 1 to 5 carbon atoms, a hydroxyl group or a halogen atom, $A^8$ represents an alkylene group having 1 to 5 carbon atoms, an alkylidene group having 2 to 5 carbon atoms, an ether group, a sulfide group, a sulfonyl group, a carbonyloxy group, a keto group, a fluorenylene group, a single bond, or a group represented by the following general formula (VII-1) or (VII-2), and q' and r' each independently represent an integer of 0 to 4.

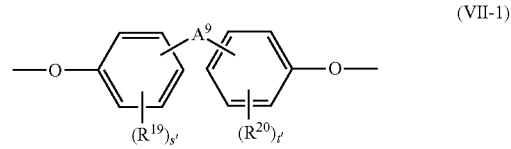

(VII-1)

In the formula, $R^{19}$ and $R^{20}$ each independently represent an aliphatic hydrocarbon group having 1 to 5 carbon atoms, or a halogen atom, $A^9$ represents an alkylene group having 1 to 5 carbon atoms, an isopropylidene group, an m-phenylenediisopropylidene group, a p-phenylenediisopropylidene group, an ether group, a sulfide group, a sulfonyl group, a carbonyloxy group, a keto group or a single bond, and s' and t' each independently represent an integer of 0 to 4.

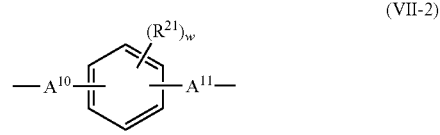

(VII-2)

In the formula, $R^{21}$ represents an aliphatic hydrocarbon group having 1 to 5 carbon atoms, or a halogen atom, $A^{10}$ and $A^{11}$ each independently represent an alkylene group having 1 to 5 carbon atoms, an isopropylidene group, an ether group, a sulfide group, a sulfonyl group, a carbonyloxy group, a keto group or a single bond, and w represents an integer of 0 to 4.

The aliphatic hydrocarbon group having 1 to 5 carbon atoms and the halogen atom that $R^{17}$, $R^{18}$, $R^{19}$, $R^{20}$ and $R^{21}$ in the above general formula (VII), (VII-1) or (VII-2) represent include the same ones as those of $R^1$ in the general formula (I). The aliphatic hydrocarbon group may be an aliphatic hydrocarbon group having 1 to 3 carbon atoms, and may be a methyl group or an ethyl group.

$A^4$ in the general formula (VI) have the same definition as $A^1$ in the general formula (Z).

The alkylene group having 1 to 5 carbon atoms and the alkylidene group having 2 to 5 carbon atoms that $A^8$, $A^9$ and $A^{10}$ in the above general formula (VII), (VII-1) or (VII-2) represent may be described in the same manner as that for the case of $A^2$ in the general formula (III). The alkylene group having 1 to 5 carbon atoms that $A^{10}$ and $A^{11}$ in the general formula (VII-2) represent may be described in the same manner as that for the case of $A^2$ in the general formula (III).

q' and r' each are an integer of 0 to 4, and from the viewpoint of easy availability, both may be an integer of 0 to 2, or may be 0 or 2. s' and t' each are an integer of 0 to 4, and from the viewpoint of easy availability, both may be an integer of 0 to 2, or may be 0 or 1, or may be 0. w is an integer of 0 to 4, and from the viewpoint of easy availability, may be an integer of 0 to 2, or may be 0.

The component (a) is not specifically limited, but for example, the same ones as those of the above-mentioned bismaleimide compound (IX) are applicable. Examples of the component (a) include bis(4-maleimidophenyl)methane, polyphenylmethanemaleimide, bis(4-maleimidophenyl) ether, bis(4-maleimidophenyl) sulfone, 3,3'-dimethyl-5,5'-diethyl-4,4'-diphenylmethanebismaleimide, 4-methyl-1,3-phenylenebismaleimide, m-phenylenebismaleimide, 2,2-bis(4-(4-maleimidophenoxy)phenyl)propane, bis(4-maleimidophenyl) sulfone, bis(4-maleimidophenyl) sulfide, bis(4-maleimidophenyl) ketone, 2,2-bis(4-(4-maleimidophenoxy)phenyl)propane, bis(4-(4-maleimidophenoxy)phenyl) sulfone, 4,4'-bis(3-maleimidophenoxy)biphenyl, 1,6-bismaleimido-(2, 2,4-trimethyl)hexane, etc. These may be used individually or in combination, depending on the object and use. The component (a) may be a bismaleimide compound, and may be bis(4-maleimidophenyl)methane from the viewpoint of inexpensiveness, may be 3,3'-dimethyl-5,5'-diethyl-4,4'-diphenylmethanebismaleimide from the viewpoint of excellent dielectric properties and low water absorption, and may be 2,2-bis(4-(4-maleimidophenoxy)phenyl)propane from the viewpoint of high adhesion to conductor and excellent mechanical properties (elongation, strength at break).

As described above, the polyaminobismaleimide compound (c) may be obtained by reacting the above component (a) and an aromatic diamine compound (b) having two primary amino groups in one molecule in an organic solvent in a mode of Michael addition reaction.

Examples of the component (b) include, though not specifically limited thereto, 4,4'-diaminodiphenylmethane, 4,4'-diamino-3,3'-dimethyl-diphenylmethane, 4,4'-diamino-3,3'-diethyl-diphenylmethane, 4,4'-diaminodiphenyl ether, 4,4'-diaminodiphenyl sulfone, 3,3'-diaminodiphenyl sulfone, 4,4'-diaminodiphenyl ketone, 4,4'-diaminobiphenyl, 3,3'-dimethyl-4,4'-diaminobiphenyl, 2, 2'-dimethyl-4,4'-diaminobiphenyl, 3,3'-dihydroxybenzidine, 2,2-bis(3-amino-4-hydroxyphenyl)propane, 3,3-dimethyl-5,5-diethyl-4, 4-diphenylmethanediamine, 2,2-bis(4-aminophenyl)propane, 2,2-bis(4-(4-aminophenoxy)phenyl)propane, 1, 3-bis(3-aminophenoxy)benzene, 1, 3-bis(4-aminophenoxy)benzene, 1, 4-bis(4-aminophenoxy)benzene, 4,4'-bis(4-aminophenoxy)biphenyl, 1,3-bis(1-4-(4-aminophenoxy)phenyl)-1-methylethylkenzene, 1, 4-bis(1-4-(4-aminophenoxy)phenyl)-1-methylethylkenzene, 4,4'-[1,3-phenylenebis(1-methylethylidene)]bisaniline, 4,4'-[1, 4-phenylenebis(1-methylethylidene)]bisaniline, 3,3'-[1,3-phenylenebis(1-methylethylidene)]bisaniline, bis(4-(4-aminophenoxy)phenyl) sulfone, bis(4-(3-aminophenoxy)phenyl) sulfone, 9,9-bis(4-aminophenyl)fluorene, etc. These components (b) may be used individually or in combination.

Among these, from the viewpoint of achieving high solubility in an organic solvent and high reaction rate for the synthesis as well as high heat resistance, the component may be selected from 4,4'-diaminodiphenylmethane, 4,4'-diamino-3,3'-dimethyl-diphenylmethane, 4,4'-diamino-3,3'-diethyl-diphenylmethane, 2,2-bis(4-(4-aminophenoxy)phenyl)propane, 4,4'-[1,3-phenylenebis(1-methylethylidene)]bisaniline, and 4,4'-[1, 4-phenylenebis(1-methylethylidene)]bisaniline. From the viewpoint of the inexpensiveness in addition to the above-mentioned high solubility, high reaction rate, and high heat resistance, the component may be 4,4'-diaminodiphenylmethane, 4,4'-diamino-3,3'-dimethyl-diphenylmethane, or 4,4'-diamino-3,3'-diethyl-diphenylmethane. Further, from the viewpoint of achieving high adhesion to conductor in addition to the above-mentioned high solubility, high reaction rate, and high heat resistance, the compound may be 2,2-bis(4-(4-aminophenoxy)phenyl)propane, 4,4'-[1,3-phenylenebis(1-methylethylidene)]bisaniline, or 4,4'-[1,4-phenylenebis(1-methylethylidene)]bisaniline. Furthermore, from the viewpoint of achieving excellent high-frequency properties and moisture absorption resistance in addition to the above-mentioned high solubility, high reaction rate, high heat resistance, and high adhesion to conductor, the component may be selected from 4,4'-[1,3-phenylenebis(1-methylethylidene)]bisaniline and 4,4'-[1,4-phenylenebis(1-methylethylidene)]bisaniline.

According to the object and use, these may be used individually or in combination.

With respect to the organic solvent used in producing the polyaminobismaleimide compound (c), there is no particular limitation. However, for example, the organic solvents mentioned above as examples in connection with the production step for the polyphenylene ether compound (A") can be applied. These may be used individually or in combination. Of these, methyl ethyl ketone, cyclohexanone, propylene glycol monomethyl ether, N, N-dimethylformamide, and N,N-dimethylacetamide may be used from the viewpoint of solubility.

With respect to the amounts of the component (a) and the component (b) used in producing the component (c), the component (a) and the component (b) may be incorporated so that the equivalent ratio (Tb2/Ta2) of the maleimide group equivalent (Tb2) of the component (a) to the —$NH_2$ group equivalent (Ta2) of the component (b) could be in the range of 1 to 10, or could be in the range of 2 to 10. When the component (a) and component (b) are used so that the equivalent ratio could be in the above range, the thermosetting resin composition, the prepreg and the laminate of the present invention can have excellent high frequency properties, high adhesion to conductor, excellent heat resistance, high glass transition temperature and powerful flame retardancy.

A reaction catalyst may not be used for the Michael addition reaction in producing the polyaminobismaleimide compound (c), but may be used as needed. The reaction catalyst is not specifically limited, and the reaction catalyst usable in the Michael addition reaction in producing the above-mentioned polyphenylene ether derivative (A) is applicable. Also as described above, the amount of the reaction catalyst to be incorporated is not specifically limited.

In the case where a maleimide compound is used as the component (B), a curing agent for the maleimide compound, a crosslinking agent, a curing aid and other may be used. These are not specifically limited, and examples thereof include vinyl compounds such as styrene monomer, divinylbenzene, divinylbiphenyl, etc.; (meth)acrylate compounds; allyl compounds such as triallyl cyanurate, triallyl isocyanurate, etc.; polyamine compounds such as diaminodiphenylmethane, etc. One alone or two or more of these may be used either singly or as combined. The amount of these to be used is not also specifically limited, and may be adequately controlled depending on the object. Among these, from the viewpoint of high frequency properties and heat resistance, vinyl compounds or polyamine compounds may be used.

The above-mentioned component (a) and component (b) and an organic solvent and optionally a reaction catalyst and others are put into a reactor each in a predetermined amount, and with heating, keeping the heat and stirring, these are reacted in a mode of Michael addition reaction to give the polyaminobismaleimide compound (c). For the reaction conditions such as the reaction temperature, the reaction time and others in this step, for example, the reaction conditions in the Michael addition reaction in producing the above-mentioned polyphenylene ether derivative (A) are applicable.

The reaction concentration (solid concentration) is not specifically limited, but may be 10 to 90% by mass, and may be 20 to 80% by mass. When the reaction concentration is 10% by mass or more, the reaction speed is not too low, and tends to be advantageous from the viewpoint of production cost. When the reaction concentration is 90% by mass or less, better solubility tends to be attained. If so, in addition, the solution viscosity may be low and the stirring efficiency tends to be good to suppress gelation. After production of the polyaminobismaleimide compound (c), a part or all of the organic solvent may be removed (for concentration), or an additional organic solvent may be added for dilution in accordance with the intended object, like in producing the polyphenylene ether derivative (A).

(Content of Component (A) and Component (B), and Content Ratio Thereof)

The content of the component (A) is not specifically limited, but is, from the viewpoint of high frequency properties, preferably 3% by mass or more relative to 100 parts by mass of the sum total of the components (A) to (C), more preferably 5% by mass or more.

The content of the component (B) is not specifically limited, but is, from the viewpoint of high frequency properties and formability, preferably 10 to 90% by mass relative to 100 parts by mass of the sum total of the components (A) to (C), more preferably 20 to 80% by mass or more.

The content ratio of the component (A) to the component (B) [(A)/(B)] is not specifically limited, and may be 5/95 to 80/20 by mass, may be 5/95 to 75/25, may be 5/95 to 70/30, and may be 10/90 to 70/30. When the content ratio of the component (A) to the total content of the component (A) and the component (B) is 5% by mass or more, more excellent high frequency properties and low moisture absorption tend to be attained. When the ratio is 80% by mass or less, more excellent heat resistance, more excellent formability and more excellent workability tend to be attained.

(Phosphorus Flame Retardant (C))

The thermosetting resin composition of the present invention further contains a phosphorus flame retardant (C). Using a phosphorus flame retardant (C), the composition enables flame retardancy impartation while realizing halogen-freeness, and not limited thereto, and aside from that, the phosphorus flame retardant (C) attains excellent high frequency properties (low dielectric constant, low dielectric dissipation factor), high adhesion to conductor, excellent heat resistance, low thermal expansion coefficient and high glass transition temperature.

One alone or two or more kinds of phosphorus flame retardants (C) may be used either singly or as combined.

Not specifically limited, the phosphorus flame retardant (C) may be any one containing a phosphorus atom among those generally used as a flame retardant, and may be an inorganic phosphorus flame retardant or an organic phosphorus flame retardant. From the viewpoint of environmental issues, preferably, the flame retardant does not contain a halogen atom. From the viewpoint of high frequency properties (low dielectric constant, low dielectric dissipation factor), adhesion to conductor, heat resistance, glass transition temperature, thermal expansion coefficient and flame retardancy, an organic phosphorus flame retardant may be used.

Examples of the inorganic phosphorus flame retardant include red phosphorus; ammonium phosphates such as monoammonium phosphate, diammonium phosphate, triammonium phosphate, ammonium polyphosphate, etc.; inorganic nitrogen-containing phosphorus compounds such as phosphoric acid amides, etc.; phosphoric acid; phosphine oxide, etc.

Examples of the organic phosphorus flame retardant include aromatic phosphates, monosubstituted phosphonic diesters, disubstituted phosphinates, metal salts of disubstituted phosphinic acids, organic nitrogen-containing phosphorus compounds, cyclic organic phosphorus compounds, etc. Among these, aromatic phosphate compounds, and metal salts of disubstituted phosphinic acids may be selected. Here, "metal salts" may be any of lithium salts, sodium salts, potassium salts, calcium salts, magnesium salts, aluminum salts, titanium salts, and zinc salts, or may be aluminum salts. Among the organic phosphorus flame retardants, aromatic phosphates may be selected.

Examples of the aromatic phosphates include triphenyl phosphate, tricresyl phosphate, trixylenyl phosphate, cresyldiphenyl phosphate, cresyl di-2,6-xylenyl phosphate, resorcinol bis(diphenyl phosphate), 1,3-phenylenebis(di-2,6-xylenyl phosphate), bisphenol A bis(diphenyl phosphate), 1,3-phenylenebis(diphenyl phosphate), etc.

Examples of the monosubstituted phosphonic diesters include divinyl phenylphosphonate, diallyl phenylphosphonate, bis(1-butenyl) phenylphosphonate, etc.

Examples of the disubstituted phosphinates include phenyl diphenylphosphinate, methyl diphenylphosphinate, etc.

Metal salts of disubstituted phosphinic acids include metal salts of dialkylphosphinic acids, metal salts of diallylphosphinic acids, metal salts of divinylphosphinic acids, metal salts of diarylphosphinic acids, etc. These metal salts may be, as mentioned above, any of lithium salts, sodium salts, potassium salts, calcium salts, magnesium salts, aluminum salts, titanium salts, and zinc salts, and aluminum salts may be selected.

Examples of the organic nitrogen-containing phosphorus compounds include phosphazene compounds such as bis(2-allylphenoxy)phosphazene, dicresylphosphazene, etc.; melamine compounds such as melamine phosphate, melamine pyrophosphate, melamine polyphosphate, melam polyphosphate, etc.

The cyclic organic phosphorus compounds include 9,10-dihydro-9-oxa-10-phosphaphenanthrene-10-oxide, 10-(2,5-dihydroxyphenyl)-9,10-dihydro-9-oxa-10-phosphaphenanthrene-10-oxide, etc.

The aromatic phosphate may be an aromatic phosphate represented by the following general formula (C-1) or (C-2), and the metal salt of a disubstituted phosphinic acid may be a metal salt of a disubstituted phosphinic acid represented by the following general formula (C-3).

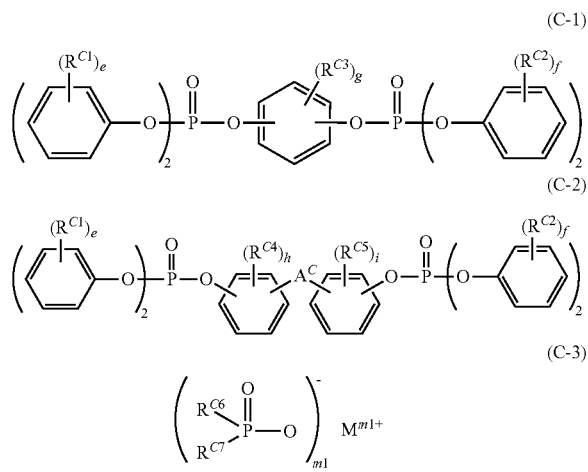

In the formulae, $R^{C1}$ to $R^{C5}$ each independently represent an aliphatic hydrocarbon group having 1 to 5 carbon atoms, or a halogen atom. $A^C$ represents an alkylene group having 1 to 5 carbon atoms, an alkylidene group having 2 to 5 carbon atoms, an ether group, a sulfide group, a sulfonyl group, a carbonyloxy group, a keto group or a single bond. e and f each independently represent an integer of 0 to 5, g, h and i each independently represent an integer of 0 to 4.

$R^{C6}$ and $R^{C7}$ each independently represent an aliphatic hydrocarbon group having 1 to 5 carbon atoms, or an aromatic hydrocarbon group having 6 to 14 carbon atoms. M represents a lithium atom, a sodium atom, a potassium atom, a calcium atom, a magnesium atom, an aluminum atom, a titanium atom, or a zinc atom. m1 represents an integer of 1 to 4.

The aliphatic hydrocarbon group having 1 to 5 carbon atoms and the halogen atom that $R^{C1}$ to $R^{C5}$ represent include the same ones as those of $R^1$ in the above-mentioned general formula (I).

The alkylene group having 1 to 5 carbon atoms and the alkylidene group having 2 to 5 carbon atoms that $A^C$ represents may be described in the same manner as that for the case of $A^2$. Among the above-mentioned choices, $A^C$ may be an alkylene group having 1 to 5 carbon atoms, an alkylidene group having 2 to 5 carbon atoms or a single bond, and may be an isopropylidene group or a single bond.

e and f each may be an integer of 0 to 2, or may be 2. g, h and i each may be an integer of 0 to 2, or may be 0 or 1, or may be 0.

The aliphatic hydrocarbon group having 1 to 5 carbon atoms that $R^{C6}$ and $R^{C7}$ represent include the same ones as those of $R^1$ in the general formula (I). The aliphatic hydrocarbon group may be an aliphatic hydrocarbon group having 1 to 3 carbon atoms, and may be an ethyl group.

Examples of the aromatic hydrocarbon group having 6 to 14 carbon atoms that $R^{C6}$ and $R^{C7}$ represent include a phenyl group, a naphthyl group, a biphenylyl group, an anthryl group, etc. The aromatic hydrocarbon group may be an aromatic hydrocarbon group having 6 to 10 carbon atoms.

m1 represents a valence of a metal ion, that is, it varies within a range of 1 to 4 depending on the kind of M.

M may be an aluminum atom. When M is an aluminum atom, m1 is 3.

(Content of Component (C))

The content ratio of the phosphorus flame retardant (C) in the thermosetting resin composition of the present invention is not specifically limited, but for example, the content of the phosphorus atom in the solid-equivalent thermosetting resin composition (the sum total of the other components than the component (D) to be mentioned below) may be 0.2 to 5% by mass, or may be 0.3 to 3% by mass. When the phosphorus atom content is 0.2% by mass or more, better flame retardancy tends to be attained. When the phosphorus content is 5% by mass or less, better formability, higher adhesion to conductor, more excellent heat resistance and higher glass transition temperature tends to be attained.

<Other Components>

The thermosetting resin composition of the present invention, if necessary, may contain at least one component selected from an inorganic filler (D) [hereinafter, frequently referred to as "component (D)"] and a curing accelerator (E) [hereinafter, frequently referred to as "component (E)"]. By virtue of containing these components, a laminate obtained using the resultant resin composition can be further improved in various properties.

For example, an appropriate inorganic filler (D) optionally incorporated in the thermosetting resin composition of the present invention can improve low thermal expansion coefficient, high modulus of elasticity, heat resistance and flame retardancy. An appropriate curing accelerator (E) incorporated in the thermosetting resin composition can improve the curability of the composition and therefore can improve high frequency properties, heat resistance, adhesion to conductor, modulus of elasticity and glass transition temperature.

Further, any other flame retardant than the above-mentioned phosphorus flame retardant (C) and a flame retardant promoter may be used along with the component (C).

(Inorganic Filler (D))

The component (D) is not specifically limited, but examples thereof include silica, alumina, titanium oxide, mica, beryllia, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, clay (calcined clay, etc.), talc, aluminum borate, aluminum borate, silicon carbide, etc. These may be used individually or in combination. Among these, from the viewpoint of thermal expansion coefficient, modulus of elasticity, heat resistance and flame retardancy, the component may be silica, alumina, mica or talc, or may be silica or alumina, or may be silica. Examples of silica include a precipitated silica produced according to a wet method and having a high water content, and a dry-method silica produced according to a dry method and containing little bound water, and further, the dry-method silica includes ground silica, fumed silica and molten silica (molten spherical silica) as grouped depending on the difference in the production method.

With respect to the shape and the particle diameter of the inorganic filler (D), there is no particular limitation, but, for example, the particle size may be 0.01 to 20 μm, or may be 0.1 to 10 μm. The term "particle diameter" used here indicates an average particle diameter, which corresponds to a particle diameter determined at a point of 50% volume in a cumulative frequency distribution curve obtained from the particle diameters when the whole volume of the particles is taken as 100%. The particle diameter can be measured by means of a particle size distribution measurement apparatus using a laser diffraction scattering method or the like.

In the case where the component (D) is used, the content ratio of the component (D) in the thermosetting resin composition is not specifically limited, but from the viewpoint of thermal expansion coefficient, modulus of elasticity, heat resistance and flame retardancy, the content ratio of the component (D) in the thermosetting resin composition may be 3 to 65% by volume, or may be 5 to 60%, or may be 15 to 55% by volume. When the content ratio of the component (D) in the thermosetting resin composition falls within the above range, better curability, formability and chemical resistance tend to be attained.

In addition, in the case where the component (D) is used, if desired, a coupling agent may be used together with it for the purpose of improving the dispersibility of the component (D) and improving the adhesion between the component (D) and the organic component in the resin composition. The coupling agent is not specifically limited, and for example, a silane coupling agent or a titanate coupling agent may be adequately selected and used. One alone or two or more kinds of coupling agents may be used either singly or as combined. The amount of the coupling agent to be used is not also specifically limited, and for example, the amount may be 0.1 to 5 parts by mass relative to 100 parts by mass of the component (D), or may be 0.5 to 3 parts by mass. Within the range, various properties can be prevented from degrading and the characteristics by the use of the component (D) tend to be effectively exhibited.

In the case where a coupling agent is used, a system of using an inorganic filler that has been previously surface-treated in dry or wet with a coupling agent may be employed, but not a so-called integral blending system where the component (D) is first incorporated in the resin composition and then a coupling agent is added thereto. Employing the former system promotes effective expression of the characteristics of the component (D).

In the case where the component (D) is contained, if desired, the component (D) may be previously dispersed in an organic solvent to be a slurry for the purpose of improving the dispersibility of the component (D) in the thermosetting resin composition. The organic solvent to be used in forming the component (D) into a slurry is not specifically limited, and for example, the organic solvents exemplified hereinabove in the production step for the polyphenylene ether compound (A") are applicable. One alone or two or more kinds of these may be used either singly or as combined. Among these, from the viewpoint of dispersibility, methyl ethyl ketone, methyl isobutyl ketone and cyclohexanone may be selected. The solid content (nonvolatile content) concentration of the slurry is not specifically limited, but for example, from the viewpoint of precipitation and dispersion performance of the inorganic filler (D), the concentration may be 50 to 80% by mass, or may be 60 to 80% by mass.

(Curing Accelerator (E))

In the case where the component (E) is contained in the thermosetting resin composition of the present invention, a suitable component (E) may be used in accordance with the kind of the component (B) to be used.

In the case where an epoxy resin is used as the component (B), examples of the component (E) include imidazole compounds and derivatives thereof; tertiary amine compounds; quaternary ammonium compounds; phosphorus compounds such as triphenyl phosphine, etc. One alone or two or more kinds of these may be used either singly or as combined. Among these, from the viewpoint of heat resistance, glass transition temperature and storage stability, imidazole compounds and derivatives thereof or phosphorus compounds may be used. Examples of the imidazole compounds include methylimidazole, phenylimidazole, isocyanate-masked imidazole (for example, addition reaction product of hexamethylene diisocyanate resin and 2-ethyl-4-methylimidazole, etc.) and others, and isocyanate-masked imidazole may be selected.

Examples of the component (E) in the case where an isocyanate resin is used as the component (B) include imidazole compounds and derivatives thereof; carboxylates with manganese, cobalt, zinc or the like; organic metal compounds such as acetylacetone complexes with a transition metal of manganese, cobalt, zinc or the like, etc. One alone or two or more kinds of these may be used either singly or as combined. Among these, from the viewpoint of heat resistance, glass transition temperature and storage stability, organic metal compounds may be used.

Examples of the component (E) in the case where a maleimide compound is used as the component (B) include acidic catalysts such as p-toluenesulfonic acid, etc.; amine compounds such as triethylamine, pyridine, tributylamine, etc.; imidazole compounds such as methylimidazole, phenylimidazole, isocyanate-masked imidazole (for example, addition reaction product of hexamethylene diisocyanate resin and 2-ethyl-4-methylimidazole); tertiary amine compounds; quaternary ammonium compounds; phosphorus compounds such as triphenyl phosphine, etc.; organic peroxides such as dicumyl peroxide, 2,5-dimethyl-2,5-bis(t-butylperoxy)hexyne-3,5-dimethyl-2,5-bis(t-butylperoxy) hexane, t-butylperoxyisopropyl monocarbonate, $\alpha,\alpha'$-bis(t-butylperoxy)diisopropylbenzene, etc.; carboxylates with manganese, cobalt, zinc or the like, etc. One alone or two or more kinds of these may be used either singly or as combined. Among these, from the viewpoint of heat resistance, glass transition temperature and storage stability, imidazole compounds, organic peroxides and carboxylates may be used; or from the viewpoint of heat resistance, glass transition temperature, modulus of elasticity and thermal expansion coefficient, an imidazole compound may be used in combination with an organic peroxide. Among organic peroxides, $\alpha,\alpha'$-bis(t-butylperoxy)diisopropylbenzene may be selected.

In the case where the component (E) is contained in the thermosetting resin composition of the present invention, the content ratio of the component (E) is not specifically limited, but for example, the ratio may be 0.01 to 10 parts by mass relative to 100 parts by mass of the sum total of the components (A) and the component (B) in the present invention, or may be 0.01 to 5 parts by mass. Using the component (E) in the range tends to secure better heat resistance and storage stability.

(Flame Retardant except Phosphorus Flame Retardant (C))

Any other flame retardant than the phosphorus flame retardant (C) and a flame retardant promoter may be contained in the thermosetting resin composition of the present invention, within a range not detracting from the advantageous effects of the present invention.

The other flame retardant than the phosphorus flame retardant (C) may be, from the viewpoint of environmental issues, a metal hydrate such as aluminum hydroxide hydrate, magnesium hydroxide hydrate or the like, and one alone or two or more kinds of these may be used either singly or as combined. The metal hydroxide may correspond to an inorganic filler, but when it is a material capable of imparting flame retardancy, the compound is grouped in the category of a flame retardant.

In the case where any other flame retardant than the phosphorus flame retardant (C) is contained in the thermosetting resin composition of the present invention, the content ratio of the flame retardant may be 50 parts by mass or less relative to 100 parts by mass of the phosphorus flame retardant (C), or may be 30 parts by mass or less, or may be 15 parts by mass or less.

(Flame Retardant Promoter)

The thermosetting resin composition of the present invention may contain a flame retardant promoter, for example, an inorganic flame retardant promoter such as antimony trioxide, zinc molybdate, etc.

When a flame retardant promoter is contained in the thermosetting resin composition of the present invention, the content ratio thereof is not specifically limited, but may be, for example, 0.1 to 20 parts by mass relative to 100 parts by mass of the sum total of the component (A) and the component (B), or may be 0.1 to 10 parts by mass. Containing a flame retardant promoter in such a range, the resin composition tends to realize better chemical resistance.

If desired, the thermosetting resin composition of the present invention may adequately contain a resin material such as a known thermoplastic resin, an elastomer, etc., as well as a coupling agent, an antioxidant, a thermal stabilizer, an antistatic agent, a UV absorbent, a pigment, a colorant, a lubricant, etc. One alone or two or more kinds of these may be contained either singly or as combined. The amount of these to be used is not specifically limited.

(Organic Solvent)

The resin composition of the present invention may contain an organic solvent, from the viewpoint of easy handleability through dilution and from the viewpoint of easy production of prepreg to be mentioned hereinunder.

Examples of the organic solvent include, though not specifically limited thereto, alcohol solvents such as ethanol, propanol, butanol, methyl cellosolve, butyl cellosolve, propylene glycol monomethyl ether, etc.; ketone solvents such as acetone, methyl ethyl ketone, methyl isobutyl ketone, cyclohexanone, etc.; ether solvents such as tetrahydrofuran, etc.; aromatic solvents such as toluene, xylene, mesitylene, etc.; nitrogen atom-containing solvents such as dimethylformamide, dimethylacetamide, N-methylpyrrolidone, etc.; sulfur atom-containing solvents such as dimethylsulfoxide, etc.; ester solvents such as γ-butyrolactone, etc.

Among these, from the viewpoint of solubility, alcohol solvents, ketone solvents or nitrogen atom-containing solvents may be used, or acetone, methyl ethyl ketone, methyl isobutyl ketone or cyclohexanone may be used, or methyl ethyl ketone may be used.

One alone or two or more kinds of organic solvents may be used either singly or as combined.

The content of the organic solvent in the thermosetting resin composition of the present invention is not specifically limited, and the solid concentration may be 30 to 90% by mass, or may be 40 to 80% by mass, or may be 40 to 70% by mass, or may be 40 to 60% by mass. The thermosetting resin composition whose solid concentration falls within the range secures good handleability and penetrability into substrate, and betters the appearance of prepreg to be produced, and the solid concentration of resin in the prepreg to be mentioned below can be readily controlled, therefore facilitating production of a prepreg having a desired thickness.

The above-mentioned components (A) to (C), and the other optional components to be combined, and optionally an organic solvent are mixed in a known method to produce the thermosetting resin composition of the present invention. In this stage, the components may be dissolved or dispersed with stirring. The conditions for the mixing order, the temperature, the time and others in mixing and stirring are not specifically limited, and may be defined in any desired manner.

The glass transition temperature of the laminate formed with the thermosetting resin composition of the present invention is not specifically limited, but from the viewpoint of good heat resistance and through-hole interconnection reliability, as well as excellent workability in producing electronic parts and others, the temperature may be 175° C. or higher, or may be 180° C. or higher, or may be 190° C. or higher. There is no specific limitation in point of the upper limit of the glass transition temperature, and for example, the temperature may be 1,000° C. or lower, or may be 500° C. or lower, or may be 300° C. or lower, or may be 230° C. or lower.

The thermal expansion coefficient (in Z direction, not higher than Tg) of the laminate formed with the thermosetting resin composition of the present invention is not specifically limited, but from the viewpoint of preventing the laminate from warping, the coefficient is preferably 45 ppm/° C. or less, more preferably 43 ppm/° C. or less. The lower limit of the thermal expansion coefficient is, though not specifically limited thereto, generally 30 ppm/° C. or more, preferably 35 ppm/° C. or more.

The glass transition temperature and the thermal expansion coefficient are values measured according to IPC Standards, as described in the section of Examples.

The dielectric constant and the dielectric dissipation factor of the laminate formed with the thermosetting resin composition of the present invention are not specifically limited. From the viewpoint of favorable use in a high frequency zone, the dielectric constant at 10 GHz is preferably smaller, and may be 3.8 or less, or may be 3.75 or less, or may be 3.65 or less. The lower limit of the dielectric constant is not specifically limited, and may be, for example, 0.5 or more, or may be 1 or more, or may be 3 or more, or may be 3.5 or more.

The dielectric dissipation factor is preferably smaller, and may be 0.007 or less, or may be 0.006 or less. The lower limit of the dielectric dissipation factor is not specifically limited and is preferably smaller, and may be, for example, 0.0001 or more, or may be 0.002 or more, or may be 0.004 or more, or may be 0.005 or more.

The dielectric constant and the dielectric dissipation factor are values according to JPCA-TM001 (Triplate-line resonator method) as described in the section of Examples.

[Prepreg]

The present invention also provides a prepreg including the resin composition of the present invention and a sheet-form fiber-reinforced substrate. The prepreg is formed using the resin composition of the present invention and a sheet-form fiber-reinforced substrate, and more specifically, the prepreg is formed by impregnating or coating a sheet-form fiber reinforced substrate with the thermosetting resin composition of the present invention, and drying the substrate. More specifically, for example, the substrate is dried by heating in a drying oven generally at a temperature of 80 to 200° C. for 1 to 30 minutes to semi-cure the resin (into a B-stage), thereby producing the prepreg of the present invention. The amount of the thermosetting resin composition to be used may be defined so that the thermosetting resin composition-derived solid concentration in the dried prepreg could be 30 to 90% by mass. When the solid concentration is controlled to fall within the range, the laminate to be obtained using the resultant prepreg can achieve excellent formability.

As the sheet-form fiber reinforced substrate for the prepreg, a known substrate used in a laminate for various electrically insulating materials is used. Examples of the materials for the sheet-form reinforced substrate include inorganic fibers of E glass, D glass, S glass, Q glass or the like; organic fibers of polyimide, polyester, tetrafluoroethylene or the like; mixtures thereof, etc. These sheet-form reinforced substrate may have, for example, a form of woven fabric, nonwoven fabric, roving, chopped strand mat, surfacing mat, etc. With respect to the thickness of the sheet-form fiber reinforced substrate, there is no particular limitation, and, for example, the substrate having a thickness of about 0.02 to 0.5 mm can be used. Further, the substrate having a surface treated with a coupling agent or the like or having a mechanically opening treated substrate can be preferably used from the viewpoint of impregnation performance with the resin composition, and from the viewpoint of heat resistance, moisture absorption resistance, and processability of the laminate formed with the substrate.

As the method of impregnating or coating the sheet-form reinforced substrate with the thermosetting resin composition, a hot melt method or a solvent method to be mentioned below may be employed.

In the hot melt method, an organic solvent is not contained in the thermosetting resin composition, and the method is (1) a method of once applying the composition onto a releasable sheet, and the laminating it on a sheet-form reinforced substrate, or (2) a method of directly applying the resin composition to a sheet-form reinforced substrate using a die coater.

On the other hand, the solvent method is a method of adding an organic solvent to the thermosetting resin composition, and immersing a sheet-form reinforced substrate in the resultant thermosetting resin composition so that the sheet-form reinforced substrate could be impregnated with the resin composition, and thereafter drying it.

[Laminate and Multilayer Printed Wiring Board]

The laminate of the present invention includes the prepreg of the present invention and a metal foil. The laminate of the present invention is formed using the prepreg of the present invention and a metal foil, and more specifically, the laminate is formed by arranging a metal foil on one surface or both surfaces of one prepreg, or by arranging a metal foil on one surface of both surfaces of a multilayer prepreg prepared by layering two or more prepregs of the present invention, and thereafter molding the resultant structure under heat and pressure.

Not specifically limited, the metal for the metal foil may be any one usable for electrically insulating materials, but from the viewpoint of electroconductivity, the metal may be copper, gold, silver, nickel, platinum, molybdenum, ruthenium, aluminum, tungsten, iron, titanium, chromium, or an alloy containing at least one of these metal elements, or may be copper or aluminium, or may be copper.

The condition for thermal pressure forming is not specifically limited. For example, the temperature may be 100° C. to 300° C., the pressure may be 0.2 to 10.0 MPa, and the time may be 0.1 to 5 hours. For thermal pressure forming, a method of using a vacuum press or the like to keep a vacuum state for 0.5 to 5 hours may be employed.

The multilayer printed wiring board of the present invention is formed using the prepreg or the laminate of the present invention. The multilayer printed wiring board of the present invention can be produced using the prepreg or the laminate of the present invention by performing circuit formation processing and bonding processing for forming a multilayer by perforating, metal plating, etching for a metal foil or the like according to a known method.

The thermosetting resin composition, the resin film, the prepreg, the metal-clad laminate and the multilayer printed wiring board of the present invention are favorably used in electronic devices working with high frequency signals of 1 GHz or more, and are especially favorably used in electronic devices working with high frequency signals of 10 GHz or more.

Hereinabove, the preferred embodiments of the present invention were described, but these embodiments are examples used for describing the present invention, and these embodiments should not be construed as limiting the scope of the present invention. The present invention can be practiced in various modes different from the above-described embodiments as long as the polyphenylene ether derivative and the like of the present invention can be obtained.

EXAMPLES

Hereinbelow, the present invention will be described in detail with reference to the following Examples, which should not be construed as limiting the scope of the present invention.

Production Example A-1

Production of Polyphenylene Ether Derivative (A-1)

Toluene (190 parts by mass), PP0640 [polyphenylene ether having a number average molecular weight of about 16,000, trade name, manufactured by SABIC Innovative Plastics Corp.] (100 parts by mass), and p-aminophenol [manufactured by Ihara Chemical Industry Co., Ltd.] (1.35 parts by mass) were charged into a glass flask container having a capacity of 2 liters and being equipped with a thermometer, a reflux condenser, and a stirrer and being capable of heating and cooling the contents of the flask, the temperature inside the flask was set at 90° C., and the contents were dissolved with heating and stirring. After confirming the dissolution visually, Perbutyl (registered trademark) I [t-butylperoxyisopropyl monocarbonate, trade name, manufactured by NOF Corporation] (2 parts by mass) and manganese naphthenate [manufactured by Wako Pure Chemical Industries, Ltd.] (0.15 parts by mass) were added to the resultant solution to perform a reaction at a solution temperature of 90° C. for 4 hours and then cooled to 70° C. to give a polyphenylene ether compound (A) having a primary amino group at the end of the molecule.

A small portion of the resultant reaction solution was taken and subjected to gel permeation chromatography (GPC). As a result, it was found that the peak derived from p-aminophenol disappeared and the polyphenylene ether compound (A') had a number average molecular weight of about 9,200. Further, another small portion of the reaction solution was taken and dropwise added to a methanol/benzene mixed solvent (mass ratio in the mixed solvent: 1:1) to cause reprecipitation, and the resultant purified solid material (reaction product) was subjected to FT-IR measurement. The result of the FT-IR measurement confirmed that a peak derived from a primary amino group appeared at around 3,400 cm$^{-1}$.

Here, the number average molecular weight was measured by gel permeation chromatography (GPC) in which standard polystyrenes were used for obtaining a molecular weight conversion calibration curve. The calibration curve was obtained using standard polystyrenes: TSK standard POLYSTYRENE (Type; A-2500, A-5000, F-1, F-2, F-4, F-10, F-20, F-40) [trade name, manufactured by Tosoh Corp.]) and approximated to a cubic equation. Conditions for GPC are shown below.
Apparatus: (Pump: L-6200 Model [manufactured by Hitachi High-Technologies Corporation]),
(Detector: L-3300 Model RI [manufactured by Hitachi High-Technologies Corporation]),
(Column oven: L-655A-52 [manufactured by Hitachi High-Technologies Corporation])
Column: Guard column; TSK Guard column HHR-L+Column; TSK gel-G4000HHR+TSK gel-G2000HHR (trade name, each of which is manufactured by Tosoh Corp.)
Column size: 6.0×40 mm (guard column), 7.8×300 mm (column)
Eluent: Tetrahydrofuran
Concentration of a sample: 30 mg/5 mL
Amount of a sample per injection: 20 μL
Flow rate: 1.00 mL/minute
Temperature for measurement: 40° C.

Then, BMI-4000 [2,2-bis(4-(4-maleimidophenoxy)phenyl)propane, trade name, manufactured by Daiwa Kasei Industry Co., Ltd.] (4.5 parts by mass) and propylene glycol monomethyl ether (10 parts by mass) were added to the above-obtained reaction solution, and the temperature of the resultant mixture was increased while stirring, and, while maintaining the temperature at 120° C., a reaction was conducted for 4 hours, followed by cooling and 200-mesh filtration, to produce a polyphenylene ether derivative (A-1).

A small portion of the resultant reaction solution was taken and subjected to reprecipitation in the same manner as mentioned above, and the resultant purified solid material was subjected to FT-IR measurement. The result of the FT-IR measurement confirmed that the peak at around 3,400 $cm^{-1}$ derived from a primary amino group disappeared and a peak of a carbonyl group of maleimide appeared at 1,700 to 1,730 $cm^{-1}$. Further, the solid material was subjected to GPC measurement (under the same conditions as mentioned above). As a result, the number average molecular weight was found to be about 9,400.

Production Example B

Production of Polyaminobismaleimide Compound (B-1) as Thermosetting Resin (B)

BMI-4000 [2,2-bis(4-(4-maleimidophenoxy)phenyl)propane, trade name, manufactured by Daiwa Kasei Industry Co., Ltd.] (100 parts by mass), Bisaniline-M [4,4'-[1,3-phenylenebis(1-methylethylidene)]bisaniline, trade name, manufactured by Mitsui Chemicals, Inc. [(14 parts by mass) and propylene glycol monomethyl ether (50 parts by mass) were charged into a glass flask container having a capacity of 1 liter and being equipped with a thermometer, a reflux condenser, and a stirrer and being capable of heating and cooling the contents of the flaks, and, while maintaining the temperature thereof at 120° C. and stirring, the resultant mixture was reacted for 3 hours, and then cooled and filtered through a 200-mesh filter to produce a polyaminobismaleimide compound (B-1) as a thermosetting resin (B).

Examples 1 to 5, Comparative Examples 1 to 3

Preparation of Thermosetting Resin Composition

The polyphenylene ether derivative (A-1) produced in Production Example A, the polyaminobismaleimide compound (B-1) produced in Production Example B, a flame retardant, an inorganic filler, a curing accelerator and an organic solvent were stirred and mixed according to the formulation of blending quantities (unit: part by mass) shown in Table 1 at room temperature or with heating to prepare thermosetting resin compositions having a solid content (nonvolatile component) concentration of 40 to 60% by mass.

Here, the resin composition (excluding inorganic filler) generally has a density of 1.20 to 1.25 $g/cm^3$, and the inorganic filler used has a density of 2.2 to 3.01 $g/cm^3$. Therefore, when 80 parts by mass of the inorganic filler is incorporated, relative to 100 parts by mass of the resin composition (excluding inorganic filler), the amount of the inorganic filler incorporated is about 30 to 34% by volume.
<Evaluation/Measurement Method>

The thermosetting resin compositions obtained in Examples and Comparative Examples were analyzed and evaluated according to the methods mentioned below. The results are shown in Table 1.
(1. Evaluation of Compatibility of Thermosetting Resin Composition)

With respect to the thermosetting resin compositions obtained in the above Example and those dried at 160° C. for 10 minutes to remove the organic solvent therefrom, the appearance thereof was visually examined, and the compatibility was evaluated (whether macroscopic phase separation or unevenness was present or not) in accordance with the criteria shown below.

A: Macroscopic phase separation or unevenness is not present.

B: Macroscopic phase separation or unevenness is present.
(2. Formation of Prepreg and Copper-Clad Laminate)

The thermosetting resin composition obtained in each Example was applied to glass cloth having a thickness of 0.1 mm [E glass, manufactured by Nitto Boseki Co., Ltd.], and then dried by heating at 160° C. for 7 minutes to prepare a prepreg having a resin content of about 54% by mass. 6 sheets of the prepared prepreg were stacked on one another, and low profile copper foils having a thickness of 18 μm (trade name, "FV-WS", M-side Rz: 1.5 μm; manufactured by The Furukawa Electric Co., Ltd.) were disposed respectively on the top and bottom of the resultant laminate so that the M-side of each copper foil was in contact with the laminate, and subjected to hot pressing under conditions such that the temperature was 230° C., the pressure was 3.9 MPa, and the time was 180 minutes to prepare a double-sided copper-clad laminate (thickness: 0.8 mm).
(2-1. Evaluation of Appearance of Prepreg)

The appearance of the above-obtained prepreg was examined. The appearance was visually examined, and the prepreg was evaluated according to the criteria shown below.

A: Nothing wrong on appearance.

C: The prepreg surface has some unevenness, streak, foaming, phase separation and the like, and lacks surface smoothness.
(2-2. Evaluation of Properties of Copper-Clad Laminate)

With respect to the above-obtained copper-clad laminate, the formability, the dielectric properties, the copper foil peel strength, the glass transition temperature, the thermal expansion coefficient, the soldering heat resistance, and the flame retardancy thereof were evaluated. The methods for evaluation of the properties of the copper-clad laminate are as described below.

(2-2-1) Formability

The appearance of the laminate having etched copper foils on both sides was examined to evaluate the formability. The formability was visually evaluated, and the laminate was evaluated according to the following criteria.

A: Nothing wrong on appearance.

C: The laminate has some unevenness, streak, thinned area, voids or the like, and lacks surface smoothness.

(2-2-2) Dielectric Properties

Regarding dielectric properties (relative permittivity, dielectric dissipation factor), dielectric constant and dielectric dissipation factor were measured at 1 GHz band and 10 GHz band according to JPCA-TM001 (Triplate-line resonator method).

(2-2-3) Copper Foil Peel Strength

Copper foil peel strength was measured in accordance with JIS-C-6481 (1996) to thereby determine the adhesion to conductor.

(2-2-4) Soldering Heat Resistance

A soldering heat resistance was evaluated using a 50 mm square test specimen having etched copper foils on both sides as follows. 3 Specimens in a dry state and 3 specimens, which had been treated in a pressure cooker test (PCT) apparatus (conditions: 121° C., 2.2 atm.) for a predetermined period of time (1, 3, or 5 hours), were immersed in molten solder at 288° C. for 20 seconds, and then the appearance of each of the resultant specimens was visually examined. The figures shown in the tables mean, among the 3 specimens obtained after immersed in the solder, the number of the specimen or specimens in which a defect, such as the occurrence of blistering or measling, was not recognized in the laminate.

(2-2-5) Glass Transition Temperature (Tg) and Thermal Expansion Coefficient

Five mm square test pieces that had been etched to remove the copper foil from both sides thereof were analyzed in accordance with IPC (The Institute for Interconnecting and Packaging Electronic Circuits) Standards using a thermomechanical analyzer (TMA) [manufactured by TA Instruments Japan Corporation, Q400 (Model Number)] to measure the glass transition temperature (Tg) and the thermal expansion coefficient (thickness direction, temperature range: 30 to 150° C.) thereof.

(2-2-6) Flame Retardancy

The copper-clad laminate was immersed in a copper etchant, 10 mass % solution of ammonium persulfate [manufactured by Mitsubishi Gas Chemical Corporation] to remove the copper foil, and a test piece having a length of 127 mm and a width of 12.7 mm was cut out of the resultant substrate for evaluation. The test piece was tested according to the test method (V method) of UL94 to evaluate the flame retardancy thereof.

Namely, the lower edge of the test piece held vertically was exposed to 20-mm flame for 10 seconds, twice in every test. The evaluation was carried out according to the criteria in the V method of UL94.

TABLE 1

| | | | Example | | | | | Comparative Example | | |
|---|---|---|---|---|---|---|---|---|---|---|
| | | | 1 | 2 | 3 | 4 | 5 | 1 | 2 | 3 |
| Polyphenylene Ether Derivative (A) | Polyphenylene Ether Derivative (A-1) | solid concentration 35% by mass | 100 | 100 | 100 | 100 | 100 | 100 | 100 | 100 |
| Thermosetting Resin (B) | Polyaminobismaleimide Compound (B-1) | solid concentration 65% by mass | 80 | 80 | 80 | 80 | 80 | 80 | 80 | 80 |
| Phosphorus Flame Retardant (C) | OP-935 | (phosphorus atom content: 23.5 mass %) | 8(2) | | | | | | | |
| | PX-200 | (phosphorus atom content: 28.6 mass %) | | 25(2) | | | | | | |
| | PX-202 | (phosphorus atom content: 33.3 mass %) | | | 30(2) | | | | | |
| | SPB-100 | (phosphorus atom content: 18.2 mass %) | | | | 16(2) | 24(2) | | | |
| | HCA-HQ | (phosphorus atom content: 26.7 mass %) | | | | | | | | |
| Other Flame Retardant | SAYTEX8010 | (bromine atom content: 82.7 mass %) | | | | | | | 2(2) | |
| | AlOOH | | | | | | | | | 53 |
| Inorganic Filler (D) | SC-2050 KNK | sold concentration 70% by mass | 83 | 98 | 101 | 90 | 96 | 78 | 0 | 76 |
| Curing Accelerator (E) | Perbutyl-P | | 1 | 1 | 1 | 1 | 1 | 1 | 1 | 1 |
| | G-8009L | solid concentration 50% by mass | 1 | 1 | 1 | 1 | 1 | 1 | 1 | 1 |
| Organic Solvent | Methyl Ethyl Ketone | | 37 | 60 | 66 | 47 | 58 | 48 | 29 | 26 |
| Thermosetting Resin Composition | Compatibility | before evaporation of organic solvent | A | A | A | A | A | A | C | A |
| | | after evaporation of organic solvent | A | A | A | A | A | A | C | A |
| Prepreg | Appearance | | A | A | A | A | A | A | C | A |
| Laminate | Formability | | A | A | A | A | A | A | C | A |

TABLE 1-continued

|  |  | Example | | | | | Comparative Example | | |
|---|---|---|---|---|---|---|---|---|---|
|  |  | 1 | 2 | 3 | 4 | 5 | 1 | 2 | 3 |
| Dielectric Constant | 1 GHz | 3.66 | 3.64 | 3.64 | 3.68 | 3.72 | 4.88 | 3.72 | 3.66 |
|  | 10 GHz | 3.63 | 3.61 | 3.61 | 3.65 | 3.70 | 4.85 | 3.70 | 3.63 |
| Dielectric Dissipation Factor | 1 GHz | 0.0042 | 0.0037 | 0.0037 | 0.0043 | 0.0043 | 0.0042 | 0.0044 | 0.0039 |
|  | 10 GHz | 0.0066 | 0.0055 | 0.0055 | 0.0067 | 0.0067 | 0.0066 | 0.0068 | 0.0057 |
| Copper Foil Peel Strength (kN/m) |  | 0.60 | 0.59 | 0.59 | 0.61 | 0.61 | 0.55 | 0.57 | 0.65 |
| Soldering Heat Resistance | ordinary state | 3 | 3 | 3 | 3 | 3 | 3 | 3 | 3 |
|  | after PCT-1 hr treatment | 3 | 3 | 3 | 3 | 3 | 2 | 3 | 3 |
|  | after PCT-3 hr treatment | 3 | 3 | 3 | 3 | 3 | 0 | 3 | 3 |
|  | after PCT-5 hr treatment | 3 | 3 | 3 | 3 | 3 | 0 | 3 | 3 |
| Glass Transition Temperature (° C.) |  | 200 | 180 | 180 | 200 | 200 | 170 | 200 | 200 |
| Thermal Expansion Coefficient (ppm/° C.) |  | 39 | 42 | 42 | 41 | 41 | 55 | 45 | 41 |
| Flame Retardancy |  | V-0 | V-0 | V-0 | V-0 | V-0 | V-0 | V-0 | V-1 |

(The unit of content is part by mass. For solution (excluding flame retardant), the content is in terms of solid content. On the other hand, for flame retardant in the form of solution, the amount is expressed in terms of mass of the entire solution, and the parenthesized value means the content in terms of the flame retardant element [phosphorus atom or bromine atom].)

Abbreviations of the materials in Table 1 are as follows.
(1) Flame Retardant

OP-935: aluminum dialkylphosphinate [metal salt of disubstituted phosphinic acid, phosphorus content: 23.5% by mass, manufactured by Clariant Corp.]

PX-200: 1,3-phenylenebis(di-2,6-xylenylphosphate), [aromatic phosphate, phosphorus content: 9% by mass, manufactured by Daihachi Chemical Industry Co., Ltd.]

PX-202: 4,4'-biphenylene-tetrakis(2,6-dimethylphenylphosphate) [aromatic phosphate, phosphorus content: 8% by mass, manufactured by Daihachi Chemical Industry Co., Ltd.]

SPB-100: polybisphenoxyphosphazene [organic nitrogen-containing phosphorus compound, phosphorus content: 13% by mass, manufactured by Otsuka Chemical Co., Ltd.]

HCA-HQ: 10-(2,5-dihydroxyphenyl)-9,10-dihydro-9-oxa-10-phosphaphenanthrene-10-oxide [cyclic organic phosphorus compound, phosphorus content: 9.6% by mass, manufactured by Sanko Co., Ltd.]

SAYTEX8010: 1,2-bis(2,3,4,5,6-pentabromophenyl)ethane [bromine flame retardant, bromine content: 82% by mass, manufactured by Albemarle Japan]

AlOOH: boehmite-type aluminum hydroxide [metal hydrate, density 3.0 g/cm$^3$, manufactured by Kawai Lime Industry Co., Ltd.]

The above-mentioned OP-935, PX-200, PX-202, SPB-100, HCA-HQ and SAYTEX8010 are trade names.
(2) Inorganic Filler SC-2050 KNK: spherical molten silica, mean particle size: 0.5 μm, surface treatment: vinylsilane coupling agent (1% by mass/solid content), dispersant: methyl isobutyl ketone, solid concentration 70% by mass, density 2.2 g/cm$^3$, trade name, manufactured by Admatechs Company Limited
(3) Curing Accelerator Perbutyl (registered trademark) P: α,α'-bis(t-butylperoxy)diisopropylbenzene, trade name, manufactured by NOF Corp.

G-8009L: isocyanate-masked imidazole (addition product of hexamethylene-diisocyanate resin and 2-ethyl-4-methyl-imidazole), trade name, manufactured by Dai-ichi Kogyo Seiyaku Co., Ltd.

As obvious from the results shown in Table 1, Examples of the present invention are excellent in compatibility of the thermosetting resin compositions and appearance of the prepregs, and the copper-clad laminates produced using these are good and well-balanced in all the formability, the high frequency properties (dielectric properties), the adhesion to conductor, the soldering heat resistance, the glass transition temperature, the thermal expansion coefficient and the flame retardancy.

On the other hand, as obvious from the results in Table 1, in Comparative Examples, some resin compositions and prepregs are not good in compatibility and appearance (Comparative Examples 1 to 3). In addition, the copper-clad laminates of Comparative Examples are inferior to those of Examples in point of any of formability, dielectric properties, adhesion to conductor, soldering heat resistance, glass transition temperature, thermal expansion coefficient and flame retardancy.

INDUSTRIAL APPLICABILITY

Using a specific thermosetting resin composition and a phosphorus flame retardant along with a polyphenylene ether derivative having a specific structure, a thermosetting resin composition having good compatibility, especially excellent high frequency properties (low electoric constant, low dielectric dissipation factor), high adhesion to conductor, excellent heat resistance, high glass transition temperature, low thermal expansion coefficient and high flame retardancy of V-0 can be obtained.

In addition, for the thermosetting resin composition, the material cost and the production cost for substrate material can be suppressed, and the working environment is excellent, and therefore, the prepreg and the laminate to be provided using the thermosetting resin composition can be favorably used for use for electronic parts such as multilayer printed wiring boards, etc.

The invention claimed is:

1. A thermosetting resin composition comprising:
(A) a polyphenylene ether derivative having an N-substituted maleimide structure-containing group and a structural unit represented by the following general formula (I) in one molecule,
(B) at least one thermosetting resin selected from the group consisting of an epoxy resin, a cyanate resin and a maleimide compound, and
(C) a phosphorus flame retardant:

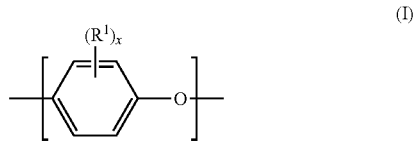

wherein $R^1$ each independently represents an aliphatic hydrocarbon group having 1 to 5 carbon atoms, or a halogen atom, and x represents an integer of 0 to 4.

2. The thermosetting resin composition according to claim 1, wherein the N-substituted maleimide structure-containing group is a group represented by the following general formula (Z):

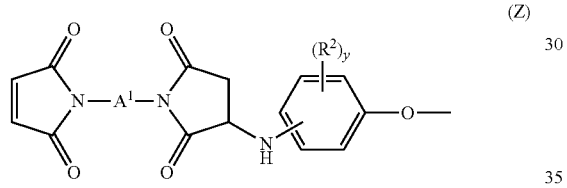

wherein $R^2$ each independently represents an aliphatic hydrocarbon group having 1 to 5 carbon atoms, or a halogen atom, y represents an integer of 0 to 4, and $A^1$ represents a group represented by the following general formula (II), (III), (IV) or (V):

wherein $R^3$ each independently represents an aliphatic hydrocarbon group having 1 to 5 carbon atoms, or a halogen atom, and p represents an integer of 0 to 4:

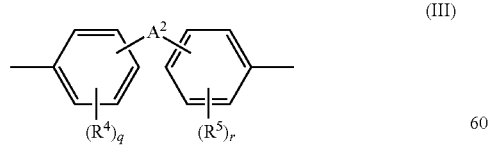

wherein $R^4$ and $R^5$ each independently represent an aliphatic hydrocarbon group having 1 to 5 carbon atoms, or a halogen atom, $A^2$ represents an alkylene group having 1 to 5 carbon atoms, an alkylidene group having 2 to 5 carbon atoms, an ether group, a sulfide group, a sulfonyl group, a carbonyloxy group, a keto group, a single bond, or a group represented by the following general formula (III-1), and q and r each independently represent an integer of 0 to 4:

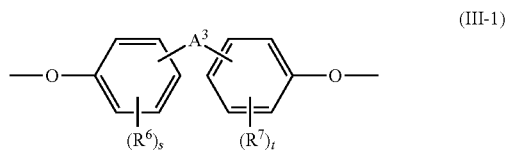

wherein $R^6$ and $R^7$ each independently represent an aliphatic hydrocarbon group having 1 to 5 carbon atoms, or a halogen atom, $A^3$ represents an alkylene group having 1 to 5 carbon atoms, an isopropylidene group, an ether group, a sulfide group, a sulfonyl group, a carbonyloxy group, a keto group or a single bond, and s and t each independently represent an integer of 0 to 4:

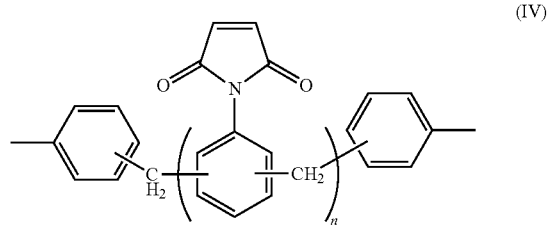

wherein n represents an integer of 0 to 10:

wherein $R^8$ and $R^9$ each independently represent a hydrogen atom, or an aliphatic hydrocarbon group having 1 to 5 carbon atoms, and u represents an integer of 1 to 8.

3. The thermosetting resin composition according to claim 1, wherein the structural unit represented by the general formula (I) is a structural unit represented by the following formula (I'):

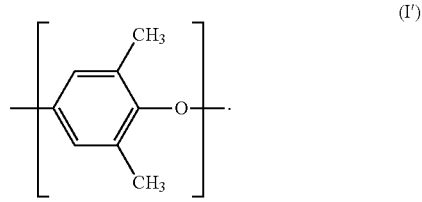

4. The thermosetting resin composition according to claim 2, wherein $A^1$ in the general formula (Z) is a group represented by any of the following formulae:

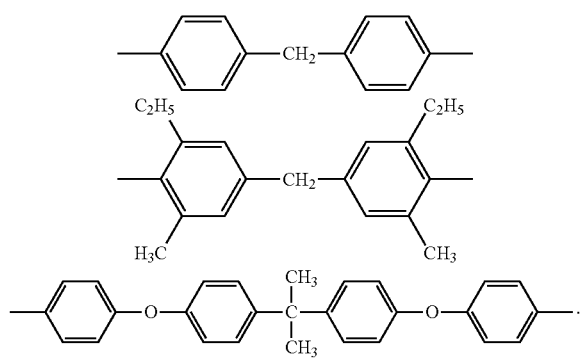

5. The thermosetting resin composition according to claim 1, wherein the phosphorus flame retardant (C) is at least one selected from an aromatic phosphate, and a metal salt of a disubstituted phosphinic acid.

6. The thermosetting resin composition according to claim 5, wherein the aromatic phosphate is represented by the following general formula (C-1) or (C-2), and the metal salt of a disubstituted phosphinic acid is represented by the following general formula (C-3):

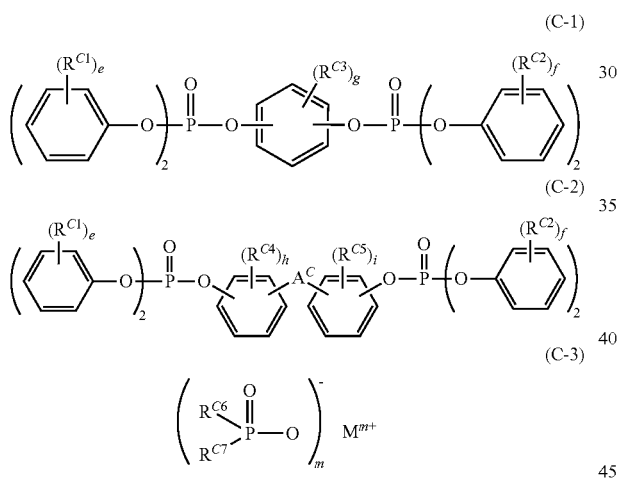

wherein $R^{C1}$ to $R^{C5}$ each independently represent an aliphatic hydrocarbon group having 1 to 5 carbon atoms, or a halogen atom, $A^c$ represents an alkylene group having 1 to 5 carbon atoms, an alkylidene group having 2 to 5 carbon atoms, an ether group, a sulfide group, a sulfonyl group, a carbonyloxy group, a keto group, or a single bond, e and f each independently represent an integer of 0 to 5, g, h and i each independently represent an integer of 0 to 4, $R^{C6}$ and $R^{C7}$ each independently represent an aliphatic hydrocarbon group having 1 to 5 carbon atoms, or an aromatic hydrocarbon group having 6 to 14 carbon atoms, M represents a lithium atom, a sodium atom, a potassium atom, a calcium atom, a magnesium atom, an aluminum atom, a titanium atom or a zinc atom, and m1 represents an integer of 1 to 4.

7. The thermosetting resin composition according to claim 1, wherein the maleimide compound as the component (B) is a polymaleimide compound (a) having at least two N-substituted maleimide groups in one molecule, or a polyaminobismaleimide compound (c) represented by the following general formula (VI):

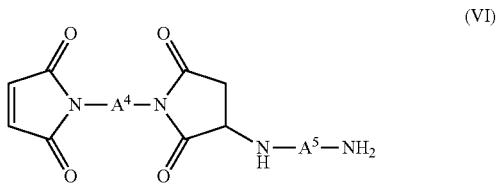

wherein $A^4$ has the same definition as that of $A^1$ in the general formula (Z), and $A^5$ represents a group represented by the following general formula (VII):

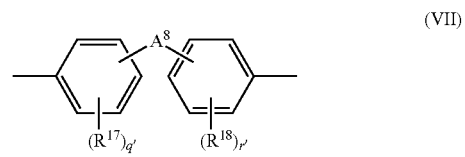

wherein $R^{17}$ and $R^{18}$ each independently represent an aliphatic hydrocarbon group having 1 to 5 carbon atoms, an alkoxy group having 1 to 5 carbon atoms, a hydroxyl group or a halogen atom, $A^8$ represents an alkylene group having 1 to 5 carbon atoms, an alkylidene group having 2 to 5 carbon atoms, an ether group, a sulfide group, a sulfonyl group, a carbonyloxy group, a keto group, a fluorenylene group, a single bond, or a group represented by the following general formula (VII-1) or (VII-2), and q' and r' each independently represent an integer of 0 to 4:

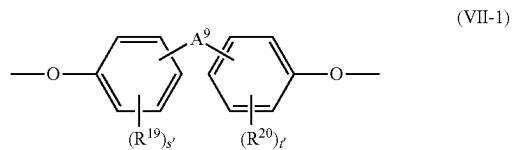

wherein $R^{19}$ and $R^{20}$ each independently represent an aliphatic hydrocarbon group having 1 to 5 carbon atoms, or a halogen atom, $A^9$ represents an alkylene group having 1 to 5 carbon atoms, an isopropylidene group, an m-phenylenediisopropylidene group, a p-phenylenediisopropylidene group, an ether group, a sulfide group, a sulfonyl group, a carbonyloxy group, a keto group or a single bond, and s' and t' each independently represent an integer of 0 to 4:

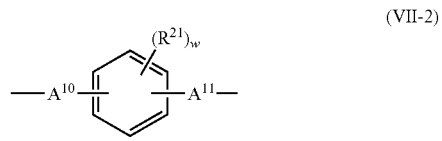

wherein $R^{21}$ represents an aliphatic hydrocarbon group having 1 to 5 carbon atoms, or a halogen atom, $A^{10}$ and $A^{11}$ each independently represent an alkylene group having 1 to 5 carbon atoms, an isopropylidene group, an ether group, a sulfide group, a sulfonyl group, a carbonyloxy group, a keto group, or a single bond, and w represents an integer of 0 to 4.

8. The thermosetting resin composition according to claim 1, wherein the content ratio of the component (A) to the component (B) [(A)/(B)] is from 5/95 to 80/20 by mass.

9. The thermosetting resin composition according to claim 1, further comprising an inorganic filler (D).

10. The thermosetting resin composition according to claim 1, further comprising a curing accelerator (E).

11. The thermosetting resin composition according to claim 1, further comprising an organic solvent.

12. A prepreg comprising the thermosetting resin composition of claim 1 and a sheet-form fiber reinforced substrate.

13. A laminate comprising the prepreg of claim 12 and a metal foil.

14. A multilayer printed wiring board comprising the prepreg of claim 12.

15. A multilayer printed wiring board comprising the laminate of claim 13.

* * * * *